US009019792B2

(12) United States Patent
Sweere et al.

(10) Patent No.: US 9,019,792 B2
(45) Date of Patent: *Apr. 28, 2015

(54) FAST STARTUP HYBRID MEMORY MODULE

(71) Applicant: Sanmina-SCI Corporation, San Jose, CA (US)

(72) Inventors: Paul Sweere, San Jose, CA (US); Jonathan R. Hinkle, San Jose, CA (US)

(73) Assignee: Sanmina-SCI Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/675,865

(22) Filed: Nov. 13, 2012

(65) Prior Publication Data
US 2013/0148457 A1 Jun. 13, 2013

Related U.S. Application Data

(62) Division of application No. 12/500,471, filed on Jul. 9, 2009, now Pat. No. 8,325,554.

(60) Provisional application No. 61/079,594, filed on Jul. 10, 2008.

(51) Int. Cl.
G11C 5/14 (2006.01)
G06F 13/00 (2006.01)
G06F 11/00 (2006.01)
G06F 12/08 (2006.01)
G11C 11/00 (2006.01)
G06F 11/14 (2006.01)

(52) U.S. Cl.
CPC ............ *G11C 5/141* (2013.01); *G06F 11/1441* (2013.01); *G06F 12/0866* (2013.01); *G11C 5/143* (2013.01); *G11C 11/005* (2013.01); *G11C 5/14* (2013.01)

(58) Field of Classification Search
CPC ..... G06F 11/1441; G06F 9/4418; G06F 1/30; G06F 11/2015; G11C 5/141; G11C 29/44; G11C 5/144
USPC ............ 365/228, 229, 185.08; 711/118, 162; 714/2
See application file for complete search history.

(56) References Cited

U.S. PATENT DOCUMENTS

| 6,185,124 | B1 * | 2/2001 | Buschbeck et al. ........... 365/149 |
| 2004/0255181 | A1 * | 12/2004 | Hsu et al. .......................... 714/2 |
| 2006/0080515 | A1 * | 4/2006 | Spiers et al. .................. 711/162 |
| 2009/0292887 | A1 * | 11/2009 | Manczak et al. .............. 711/162 |
| 2010/0180068 | A1 * | 7/2010 | Matsumoto et al. .......... 711/103 |

* cited by examiner

Primary Examiner — Vanthu Nguyen
Assistant Examiner — Ajay Ojha
(74) Attorney, Agent, or Firm — Loza & Loza, LLP; Julio M. Loza

(57) ABSTRACT

A memory device is provided comprising: a volatile memory device, a non-volatile memory device, a memory control circuit volatile memory controller coupled to the volatile memory device and non-volatile memory device, and a backup power source. The backup power source may be arranged to temporarily power the volatile memory devices and the memory control circuit upon a loss of power from the external power source. Additionally, a switch may serve to selectively couple: (a) a host memory bus to either the volatile memory device or non-volatile memory device; and (b) the volatile memory device to the non-volatile memory device. Upon reestablishment of power by an external power source from a power loss event, the memory control circuit is configured to restore data from the non-volatile memory device to the volatile memory device prior to a host system, to which the memory device is coupled, completes boot-up.

12 Claims, 22 Drawing Sheets

COMPUTER ARCHITECTURE

*COMPUTER ARCHITECTURE*

| Byte | Bit | Name | Default | R/W | Description |
|---|---|---|---|---|---|
| Byte 0 | <1:0> | RDCS<1:0> | 0,0 | RO | RAID DIMM Current State:<br>00 -> IDLE<br>01 -> CLEAR in process,<br>10 -> SAVEW in progress,<br>11 -> RESTORE in progress.<br>Bit 1 can be checked to see if the module is busy performing a SAVE or RESTORE and unavailable to the host system. |
| | 2 | Save_Data_Valid | 0 | RO | 1 -> Data in non-volatile memory is valid and ready to be transferred to volatile memory.<br>0 -> Non-volatile memory does not contain saved data that has not been restored. |
| | 3 | Restore_Complete | 0 | RO | 1 -> Successful RESTORE completed since last power cycle |
| | 4 | Power_Fail_Mode | 0 | RO | 1 -> Indicates that the memory module detects that host power is below a minimum threshold and is operating off supercapacitor power. |

FIG. 25A

| Byte | Bit | Name | Default | R/W | Description |
|---|---|---|---|---|---|
| Byte 0 | 5 | Data_Safe | 0 | RO | 1 -> Indicates that the supercapacitor can now support a SAVE operation from volatile memory using only memory module backup power. |
|  | 6 | Clear_Complete | 0 | RO | 1 -> Indicates the CLEAR operation has been successfully completed. This bit is cleared when a SAVE operation is initiated. |
|  | 7 | RFU | 0 | RO |  |

Notes: RO = Read-only,
RW = Read/Write,
RFU = Reserved for Future Use

FIG. 25B

| Byte | Bit | Name | Default | R/W | Description |
|---|---|---|---|---|---|
| Byte 1 | 0 | Auto_Save | 1 | RW | 1-> Auto save on all power downs versus only Saving when it is triggered by hardware interrupt or software force save |
| | 1 | Auto_Restore | 0 | RW | 1-> Automatically restore on power up if there was a previously successful Save operation due to power fail. |
| | 2 | RFU | 0 | RW | |
| | 3 | Ignore_HW_Interrupt | 0 | RW | 1-> Mask the Save n HW Interrupt pin and do not trigger the Save process. |
| | 4 | RFU | 0 | RW | |
| | 5 | RFU | 0 | RW | |
| | 6 | Disable_Save | 0 | RW | 1-> Disable the SAVE process so that it is not triggered. |
| | 7 | RFU | 0 | RW | |

FIG. 26

| Byte | Bit | Name | Default | R/W | Description |
|---|---|---|---|---|---|
| Byte 5 | 0 | Force_Save | 0 | RW | 1-> SAVE operation will be initiated. This bit is cleared after the SAVE process starts. |
| | 1 | Force_Restore | 0 | RW | 1-> RESTORE operation will be initiated. This bit is cleared after the RESTORE process starts. |
| | 2 | Abort_Save | 0 | RW | 1-> If a SAVE operation is being performed, it will be aborted. This bit is cleared after read, but before the controller moves into the IDLE state. |
| | 3 | Restore_Defaults | 0 | RW | 1-> Restores all module configuration options to the default settings. This bit is cleared after default configuration is restored. |
| | 4 | RFU | 0 | RW | |
| | 5 | RFU | 0 | RW | |
| | 6 | Force_Clear | 0 | RW | 1-> All data contents of NVM will be erased. Bit is cleared after the process starts. If Power_Fail_Mode is set, the Force_Clear bit is ignored and cleared on the next clock cycle. |
| | 7 | RFU | 0 | RW | |

FIG. 27

FAST STARTUP HYBRID MEMORY MODULE

CLAIM OF PRIORITY UNDER 35 U.S.C. §119

The present Application for Patent is a divisional of, and claims priority to, U.S. Utility patent application Ser. No. 12/500471 filed Jul. 9, 2009, which claims priority on Provisional Application No. 61/079,594 entitled "Battery-Less RAID DIMM", filed Jul. 10, 2008, assigned to the assignee hereof and hereby expressly incorporated by reference herein.

FIELD

At least one feature relates to memory devices, and more particularly, to memory modules having integrated, battery-less backup function.

BACKGROUND

Some mission-critical servers and storage systems employ Redundant Array of Inexpensive Drives (RAID) disk controllers for fault tolerance to reduce the likelihood of data loss in the event of a hardware fault. To improve performance, many RAID controllers use a RAID cache. A RAID cache provides temporary storage for data transfers between host and disk subsystems. Typically, such RAID cache is implemented with a dynamic random access memory (DRAM) based dual in-line memory modules (DIMM) (e.g., 256 MB-4 GB capacity). RAID cache data loss can occur in the event of a power failure. The cache often will momentarily contain the only copy of a piece of write data until that data can be written to the disk If power is lost before data is written to the disk, the data is gone forever. To avoid data loss on power fail, some prior art RAID cache DIMM's are backed-up by batteries. When the system power fails, the battery kicks in to supply power to the DIMM, thus sustaining the data until power can be restored. Once power is restored, the "dirty" data in the cache is flushed to disk.

However, such use of batteries to provide backup power to the RAID cache DIMM's means that the batteries may need to be replaced regularly which is inconvenient and hinders the availability of the RAID DIMM. Consequently, a way is needed to provide backup to the cache and/or memory DIMM's that does not rely on batteries.

SUMMARY

A memory module is provided comprising a substrate, volatile memory, non-volatile memory and a logic device. The substrate may include an interface to a host system. One or more volatile memory devices may be mounted on the substrate. One or more non-volatile memory devices may be mounted on the substrate. The logic device may be coupled to the one or more volatile memory devices, the one or more non-volatile memory devices, and the interface. The logic device may be configured to: (a) receive a first indicator of a first external triggering event, and/or (b) copy data from the one or more volatile memory devices to the one or more non-volatile memory devices upon receipt of the first indicator. The first external triggering event may be one of an external power failure, a hardware signal, or a system host command.

The memory module may also comprise a voltage detector that monitors the voltage of an external power source and generates the first indicator of the first external triggering event if the voltage level of the external power source falls below a threshold level. The voltage detector clears the first indicator of the first external triggering event if voltage of the external power source is above the threshold level.

In one example, the logic device may be further configured to: (a) electrically decouple the host system from the one or more volatile memory devices after receiving the first indicator of the first external triggering event; and/or (b) electrically couple the one or more volatile memory devices to the one or more non-volatile memory devices prior to copying the data.

In another example, the logic device may be further configured to: (a) receive a second indicator of a second external triggering event; (b) restore the data from the one or more non-volatile memory devices to the one or more volatile memory devices based on receipt of the second indicator; (c) electrically decouple the one or more non-volatile memory devices from the one or more volatile memory devices after restoring the data; and/or (d) electrically couple the one or more volatile memory devices to the host system after restoring the data. Note that the second indicator may be indicative that the first indicator has been cleared. In some implementations, the second indicator may be received via a different interface than the first indicator or the second external triggering event may be independent of the first external triggering event.

The memory module may further comprise a passive backup power source that is charged by the external power source, the passive backup power source temporarily providing power to the memory module if power loss from the external power source occurs. The passive backup power source may include one or more super-capacitors of between five and thirty Farads or ten to fifty Farads, for example. The passive backup power source may keep the memory module operational for at least four (4) seconds after power loss from the external power source. The passive backup power source may be mounted over the one or more volatile memory devices or the one or more non-volatile memory devices.

In one example, the memory module may have a thickness of between 7.5 millimeters and 10.5 millimeters. The memory module may have a height of between 27 millimeters and 33 millimeters.

The memory module may further comprise a power connector separate from the interface, the power connector for coupling the memory module to a passive backup power source which is utilized by the memory module if power loss from the external power source occurs.

In one example, the logic device may include: (a) a volatile memory controller selectively coupled to the one or more volatile memory devices; (b) a non-volatile memory controller coupled to the on the one or more non-volatile memory devices; (c) a buffer coupled between the volatile memory controller and the non-volatile memory controller; and/or (d) a control circuit coupled to the volatile memory controller and the non-volatile memory controller. The control circuit may be adapted to: (a) switch connectivity for the one or more volatile memory devices from the host system to the one or more non-volatile memory devices upon obtaining the indicator of the triggering event; and/or (b) switch connectivity for the one or more volatile memory devices from the one or more non-volatile memory devices to the host system when the indicator of the triggering event is cleared.

Additionally, the logic device may be further configured to: (a) provide internal status information to the host system via a first external register for data stored in the memory module; (b) obtain an indication from the host system via a second external register to initiate an internal data save, data restore, or data clear process for data already stored in the memory module; and/or (c) obtain configuration information from the host system via a third external register to configure internal data save and data restore processes for data already stored in the memory module.

A method is also provided, the method being operational on a memory module having volatile memory and non-volatile memory to save data upon indication of an external triggering event. A first indicator of a first external triggering event is obtained by the memory module. Data from volatile memory is saved into non-volatile memory upon the receipt of the first indicator of the first external triggering event. The memory module may switch to a backup power source specific to the memory module upon receipt of the first indicator. Additionally, the memory module may (a) decouple a host system from the one or more volatile memory devices upon receipt of the first indicator of the first external triggering event; and/or (b) couples the one or more volatile memory devices to the one or more non-volatile memory devices prior to backing up the data. A second indicator may be obtained of a second external triggering event. Data from the non-volatile memory may be restored to the volatile memory based on receipt of the second indicator. Note that the second indicator may be indicative that the first indicator has been cleared. In some implementations, the second indicator may be received via a different interface than the first indicator or the second external triggering event may be independent of the first external triggering event. The non-volatile memory is decoupled from the volatile memory after restoring the data. The volatile memory may then be coupled to a host system after restoring the data.

An integrated circuit is also provided, comprising: (a) an first interface for a first bus to and from a host system; (b) a second interface for a second bus to and from volatile memory; (c) a third interface for a third bus to and from non-volatile memory; and/or (d) a switch coupled to the first interface, second interface and third interface. The switch may be configured to: (a) electrically couple the first bus to the second bus in a first mode of operation, (b) electrically couple the first bus to the third bus in a second mode of operation, and/or (c) electrically couple the second bus to the third bus in a third mode of operation. The switch may be adaptable between the first mode, second mode, and third mode based on an indicator of an external triggering event. The integrated circuit may further comprise: (a) a non-volatile memory controller between the switch and the third interface to convert signals between the first bus and the third bus; (b) a volatile memory controller between the switch and the second interface to convert signals between the first bus and the second bus; (c) a volatile memory controller electrically coupled to the second bus; (d) a non-volatile memory controller electrically coupled to the third bus; and/or (e) a buffer coupled between the volatile memory controller and the non-volatile memory controller to facilitate data transfers directly between the second bus and the third bus.

BRIEF DESCRIPTION OF THE DRAWINGS

The features, nature, and advantages of the present aspects may become more apparent from the detailed description set forth below when taken in conjunction with the drawings in which like reference characters identify correspondingly throughout.

FIG. 25A illustrates different byte registers and how a host system (e.g., RAID controller) may check the status and/or set options for a memory module using these byte registers.

FIG. 25B illustrates different byte registers and how a host system (e.g., RAID controller) may check the status and/or set options for a memory module using these byte registers.

FIG. 26 illustrates different byte registers and how a host system (e.g., RAID controller) may check the status and/or set options for a memory module using these byte registers.

FIG. 27 illustrates different byte registers and how a host system (e.g., RAID controller) may check the status and/or set options for a memory module using these byte registers.

DETAILED DESCRIPTION

While certain exemplary embodiments have been described and shown in the accompanying drawings, it is to be understood that such embodiments are merely illustrative of and not restrictive on the broad invention, and that this invention is not be limited to the specific constructions and arrangements shown and described, since various other modifications may occur to those ordinarily skilled in the art.

Overview

A first feature provides a memory module with a passive backup power source that allows the memory module to backup data from volatile memory devices to non-volatile memory devices. If a triggering event such as host power loss is detected, the power stored in the passive backup power source is utilized to keep sufficient components on the memory module powered long enough to transfer data from the volatile memory devices to the non-volatile memory devices. Upon detection that the power loss event has been cleared (e.g., external power has been restored), the backed-up data is copied from the non-volatile memory devices to the volatile memory devices.

A second feature provides for the passive backup power source to be integrated with the memory module. Such integrated passive backup power source may be a super-capacitor that is mounted on at least one side of the memory module and is charged by the external power provided to the memory module (typically through a bus with a host system). The super-capacitors may have a thin profile such that the thickness of the memory module is not significantly increased. In an alternative implementation, the memory module may include a power connector (separate from an interface to the host system) that allows coupling to an external backup power source.

A third feature provides a controller capable of transferring data between volatile and non-volatile memory devices in a memory module based on an external trigger, such as detected power conditions. The controller may be adapted to backup or restore data depending on the state or condition of the external power source. In backup mode, the controller may be adapted to decouple the volatile memory from the host system and couple it to the non-volatile memory devices. Conversely, once data has been restored from the non-volatile memory devices to the volatile memory devices, the volatile memory devices can be decoupled from the non-volatile memory devices and coupled to the host system.

Example Operating Environment

Figure 1:
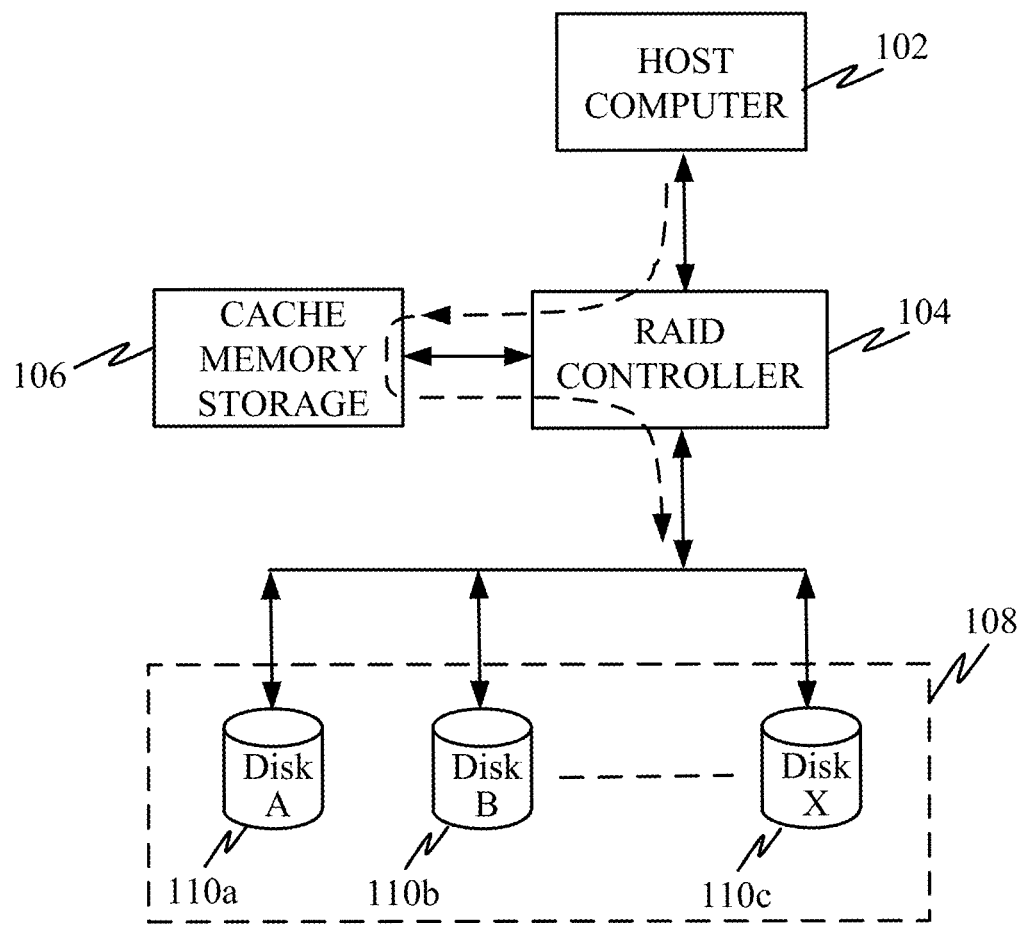
FIG. 1 is a block diagram illustrating one example of a system in which memory modules with integrated data backup may be employed.

FIG. 1 is a block diagram illustrating one example of a system in which memory modules with integrated data backup may be employed. In this example, a host computer 102 may be coupled to a redundant array of independent disks (RAID) 108 via a RAID controller 104. A RAID 108 is typically utilized to permit the host computer 102 to achieve high levels of storage reliability from low-cost and less reliable disk-drive components 110a, 110b, and 110c, by arranging the disk-drive components 110a, 110b, 110c into arrays for redundancy. The RAID controller 104 may be designed or configured to divide and replicate data from the host computer 102 among the multiple disk-drive components 110a, 110b, 110c. Some types of RAID systems may be arranged so that they provide faster read and/or write access from the RAID than would otherwise be possible from a single disk-drive. However, the operation of the RAID 108 may be transparent to the host computer 102, so that the RAID 108 may be seen by the host computer 102 (or its operating system) as a single disk-drive.

In some instances, the RAID controller 104 may include cache memory storage 106 which may be used to temporarily store data as it is transferred from the host computer 102 to the RAID 108. In one example, the cache memory storage 106 may include may include volatile memory devices arranged as a double data rate (DDR) dual in-line memory modules (DIMM) (e.g., 256 MB-4 GB capacity).

The cache memory storage 106 may allow faster storage and retrieval of data than to the RAID disk-drives 110 and may also act as temporary storage as data is redundantly stored to a plurality of the RAID disk-drives 110. However, some prior art cache memory devices may be susceptible to data loss in the event of power failure. Data loss from cache memory storage may be unrecoverable and cause inconsistencies in data stored among the RAID disk-drives 110.

To prevent such data loss in the event of power failure, the cache memory storage 106 may include a passive backup power source (e.g., such as an ultra-thin capacitor). While external power is available, the backup power source is charged. If a power failure event (e.g., low voltage level) is detected, the backup power source provides sufficient power long enough (e.g., 8 to 10 seconds) to backup data from the volatile memory devices to on-board non-volatile memory devices. When external power is reestablished to its normal level, data stored in the non-volatile memory devices can be copied to the volatile memory devices and/or flushed to the disk-drives 110.

Example Cache Memory Module with Power Backup

Figure 2:
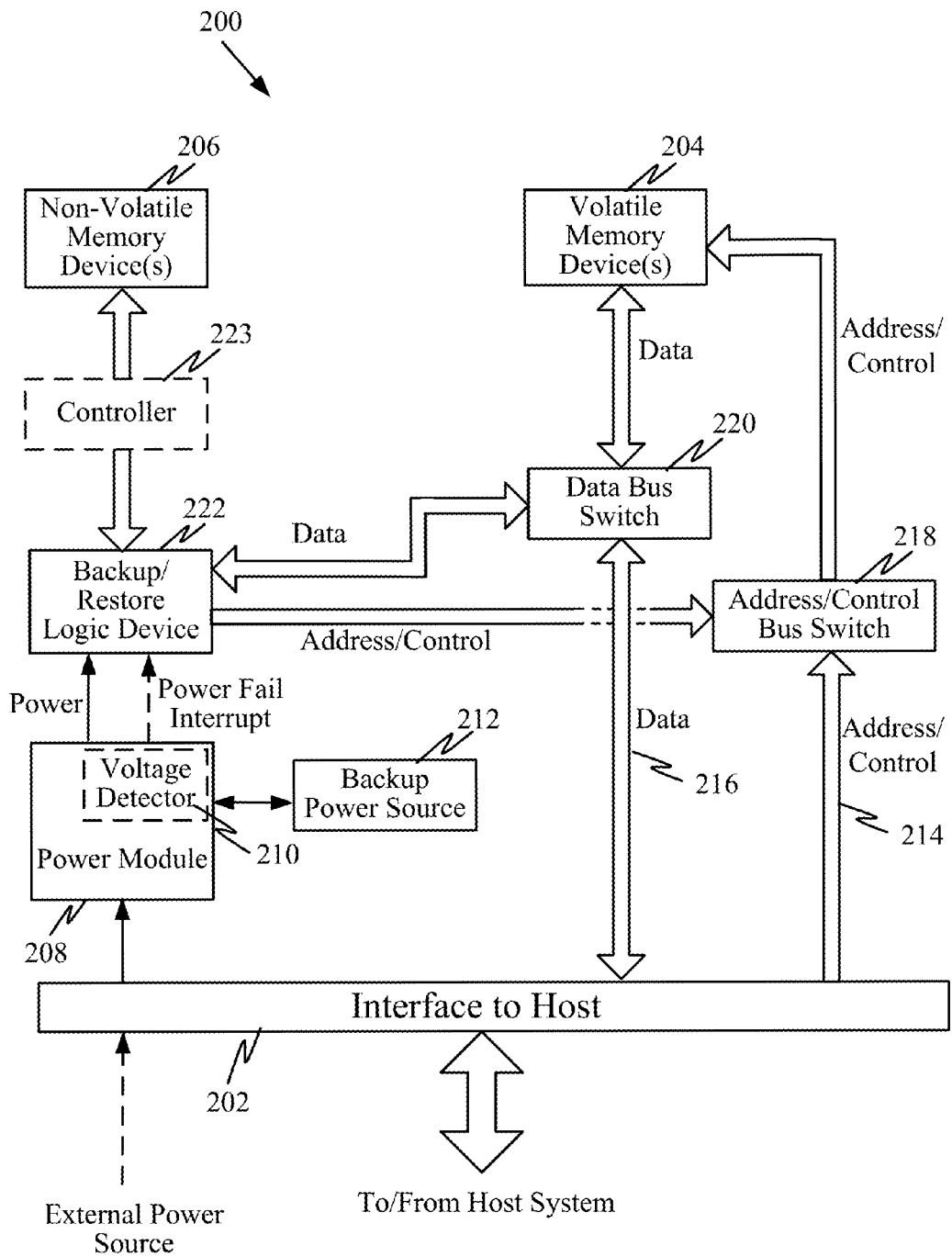
FIG. 2 is a block diagram illustrating components of a memory module with integrated power backup and configured to perform data backup upon occurrence of an external triggering event.

FIG. 2 is a block diagram illustrating components of a memory module with integrated power backup and configured to perform data backup upon occurrence of an external triggering event (e.g., power failure event, hardware signal or interrupt, software trigger, system host command, etc.). The memory module 200 may include a substrate with an interface 202 (e.g., bus interface, edge connector, one or more connecting sockets, etc.) for electrically and/or physically coupling the memory module 200 to an external bus that may provide data information, address information, control information, power/ground, etc., from a host system (e.g., RAID controller or other source).

The memory module 200 may also include one or more onboard volatile memory devices 204 (e.g., double data rate (DDR) synchronous dynamic random access memory (DRAM), including DDR2 and DDR3, etc.) which rely on power to maintain the information/data stored therein. The memory module 200 may also include one or more onboard non-volatile memory devices 206 (e.g., flash, etc.) which do not need power maintain information/data stored therein. The memory module 200 main include additional components to allow storage and/or retrieval of data. One or more of these components may allow data stored in the one or more volatile memory devices 204 to be backed up in the one or more non-volatile memory devices 206 when a triggering event (e.g., a power interruption, hardware signal, and/or host system command) is detected, thereby preventing loss of data. The memory module 200 may be adapted to receive an indicator when one or more different types of triggering events occur or are cleared.

In one example, the memory module 200 may include a power module 208 that receives external power (e.g., via the interface 202) and provides such power to one or more of the components of the memory module 200. The power module 208 may be coupled to a backup power source 212. In one example, the backup power source 212 may be, for instance, a passive component such as an ultra-thin capacitor. When the external power source provides a normal voltage level to the power module 208, the backup power source 212 is charged. A voltage detector 210 may determine when the external power source fails to provide a normal, typical, or minimum voltage level, which is indicative of an imminent power failure and loss of data stored in the one or more volatile memory devices 204. If such low voltage condition is detected by the voltage detector 210, it causes the backup power source 212 to provide power to one or more of the components of the memory module 200. That is, if a low voltage condition occurs, the backup power source 212 provides enough power to the memory module 200 to allow data stored in the volatile memory devices 204 to be stored or backed up to the non-volatile memory devices 206. When the voltage detector 210 subsequently detects a normal voltage condition from the external power source, it may copy or restore the backed up data from the non-volatile memory devices 206 to the volatile memory devices 204 and/or to an external disk (e.g., RAID).

To accomplish such data backup, the memory module 200 may include an address/control bus switch 218 that receives address and/or control information from the interface (e.g., via an address/control bus 214) and directs it to either the volatile memory devices 204 or the non-volatile memory devices 206 (via a backup/restore logic device 222). Similarly, the memory module 200 may include a data bus switch 220 that receives address and/or control information from the interface (e.g., via a data bus 216) and directs it to either the volatile memory devices 204 or the non-volatile memory devices 206 (via the backup/restore logic device 222). That is, when the external power source provides a normal voltage (e.g., a voltage level equal to or greater than a threshold voltage level), then the address/control bus switch 218 and the data bus switch 220 route the address/control bus 214 and data bus 216, respectively, to the volatile memory devices 204. Conversely, if the external power supply provides a low voltage (e.g., a voltage level less than a threshold voltage level), then the address/control bus switch 218 and the data bus switch 220 route the address/control bus 214 and data bus 216, respectively, to the non-volatile memory devices 206 (via the backup/restore logic device 222). Note that the address/control bus 214 may provide an address and/or control signals used to write (store) data in the data bus 216 to the volatile memory devices 204 or read (retrieve) data from the volatile memory devices 204.

The backup/restore logic device 222 may be adapted to convert a first bus type to a second bus type to facilitate data transfers between the volatile memory devices 204 and the non-volatile memory devices 206. In a first mode of operation, when a power failure has been detected, the logic device 222 may be configured to back up data from the volatile memory devices 204 to the non-volatile memory devices 206. Additionally, in a second mode of operation, when external power has been restored, the logic device 222 may be configured to restore data from the non-volatile memory devices 206 to the volatile memory devices 204. The backup/restore circuit 222 may be implemented by one or more controllers, circuits, processors, application specific integrated circuits, programmable logic arrays, and/or switches.

The memory module 200 may, optionally, include a controller 223 between the backup/restore logic device 222 and the non-volatile memory devices 206 which may serve to write/read data to/from the non-volatile memory devices 206 and/or convert signals between two different types of interfaces or busses (e.g., between a DDR DRAM bus and a SATA flash bus). In other implementations, the controller 223 may be omitted (e.g., where its functionality is performed by the controller 223 or where conversion between different busses is not needed).

Note that the backup power source 212 need only provide operating power to the memory module 200 for only a moment (just a few seconds) to allow time for data to be copied from the volatile memory devices 204 to the non-volatile memory devices 206 when a power failure is detected. The amount of time needed to copy data from the volatile memory devices 204 to the non-volatile memory devices 206 will depend on the speed of the read time of the volatile memory devices 204 and the write time of the non-volatile memory devices 206 and the amount of data being copied. In some instances, the whole content of the volatile memory devices 204 may be copied to the non-volatile memory devices 206; therefore, the amount of time needed to backup data is dependent on the capacity of the volatile memory devices 204.

The backup/restore logic device 222 may also be adapted to receive other indicators of an external triggering event. For example, a host system may generate and send a hardware signal and/or a host system command to the memory module 200 indicating an external triggering event. The host system may generate such hardware signal and/or software command when a triggering event is sensed. It may also provide an indicator that such triggering event has been cleared.

Figure 3:
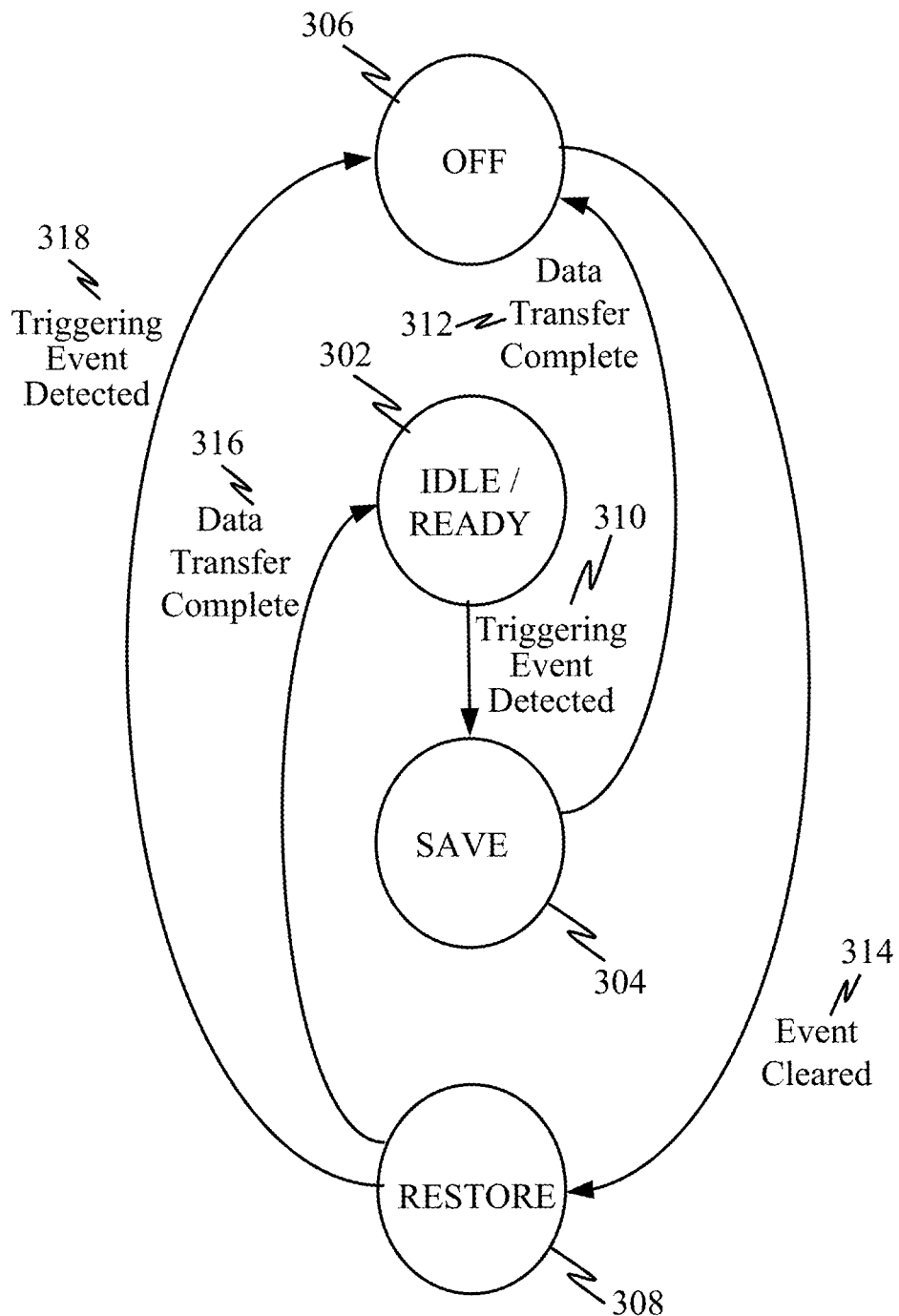
FIG. 3 illustrates a state diagram that may be implemented in a memory module to backup data upon detection of an external triggering event.

FIG. 3 illustrates a state diagram that may be implemented in a memory module to backup data upon detection of an external triggering event (e.g., power failure, hardware signal, host system command, etc.). In one example, the state diagram may be implemented by the backup/restore logic device 222 of the memory module 200. Under normal operation, the logic device is in an idle or ready state 302 which may include checking for a triggering event or condition (e.g., low-voltage, hardware signal, software interrupt, etc.). In an idle or ready state 302, no read and/or write operations to the non-volatile memory occur. Avoiding write operations to the non-volatile memory devices during the idle or ready state helps preserve the lifetime of the non-volatile memory devices. The memory module may monitor for (or receive an indicator of) an external triggering event (e.g., a low voltage, loss of power event, etc.). That is, a host system may generate an indicator of a triggering event. Such indicator is received, monitored, and/or obtained by the memory module.

If a triggering event is detected 310, a save or backup state 304 is entered in which the data in the volatile memory devices is transferred to the non-volatile memory devices. For example, where the volatile memory devices have a combined a size or capacity of 512 megabytes, the data save or backup operation may be performed within eight (8) seconds or less. Note that the speed at which the data can be saved or backed up will depend on the total size of the volatile memory devices among other factors. Additionally, the amount of time a backup power source (e.g., super-capacitors on the memory module) can sustain operations may be increased or decreased according to the time needed (e.g., by using larger or smaller Farad capacitors). The volatile memory devices may be refreshed during a save state 304 to avoid data loss.

After data transfer 312 is complete, the memory module enters an Off state 306 in which the volatile memory (and other components on the memory module) is powered Off. After the triggering event is cleared 314 (e.g., normal voltage is reestablished from the external power source, or the triggering event is cleared), data in non-volatile memory devices may be copied or transferred 316 to the volatile memory devices or an external disk-drive. However, should a triggering event (e.g., low-voltage, etc.) be detected 318 during the restore state 308, the state is changed back to the Off state 306 While in the restore state 308, access to the volatile memory devices by an external host may be blocked while restore operations take place. In most instances, this should not cause a problem since the restore operations should be completed long before the host has completed operating system boot up.

Figure 4:
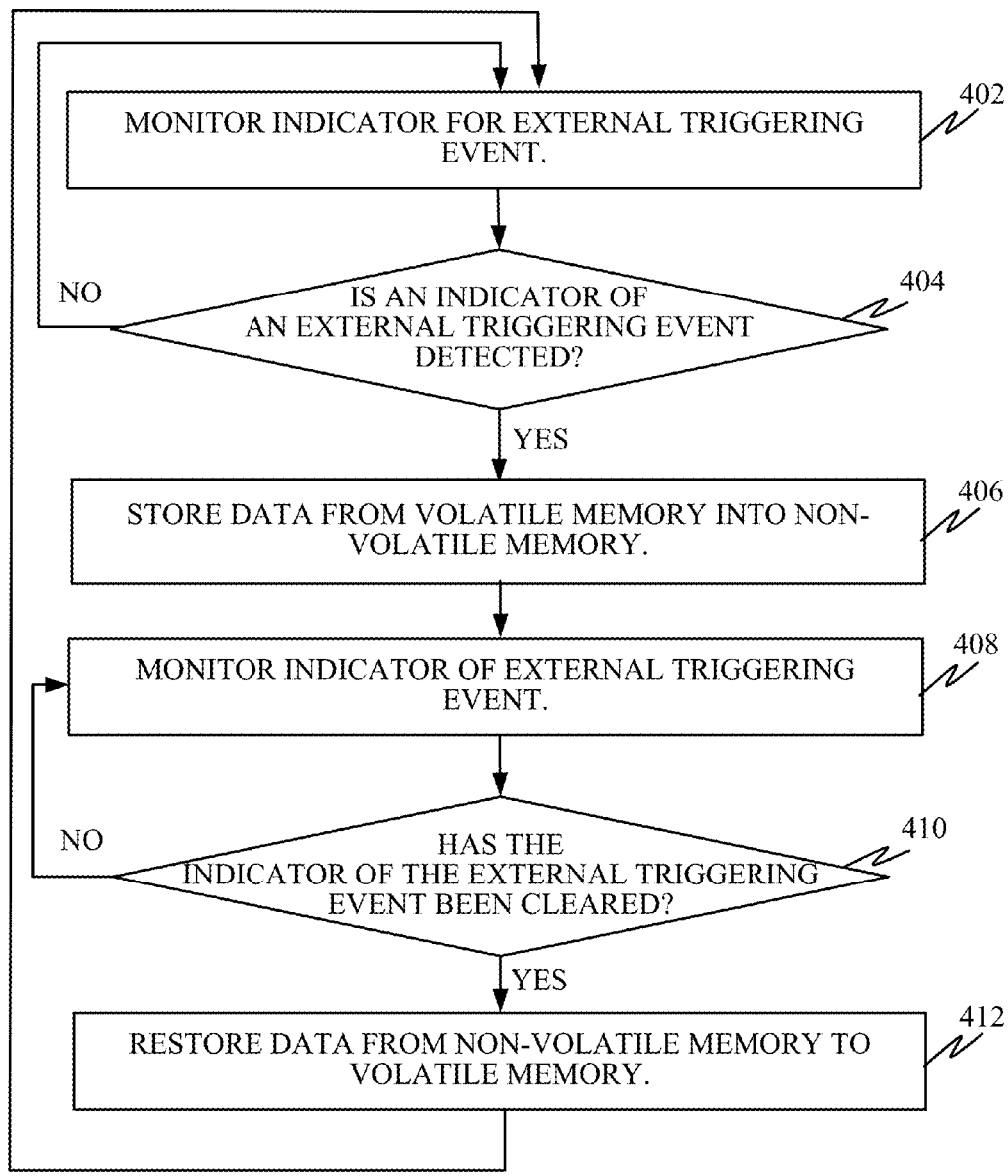
FIG. 4 illustrates a method operational on a memory module to copy data from volatile memory to non-volatile memory to prevent data loss when a low voltage event is detected.

FIG. 4 illustrates a method operational on a memory module to copy data from volatile memory to non-volatile memory to prevent data loss when an external triggering event is detected. During normal operation, the memory module monitors, obtains, and/or receives an indicator of an external triggering event 402 (e.g., low voltage event, power failure event, hardware signal such as an interrupt, system host command, etc.). If an indicator of an external triggering event is detected 404 (e.g., voltage to the memory module provided by an external power source falls below a threshold voltage level), then data from volatile memory is retrieved and stored into non-volatile memory 406. The memory module may continue to monitor the indicator of the external triggering event 408. If the indicator of the external triggering event has been cleared 410 (e.g., the external voltage is above or equal to the threshold voltage level), data from the non-volatile memory is restored to the volatile memory 412 (or saved to a disk drive). For example, the memory module may wait (in an Off state) until the external power source provides a minimum amount of voltage again to restore the data to the volatile memory.

Figure 33:
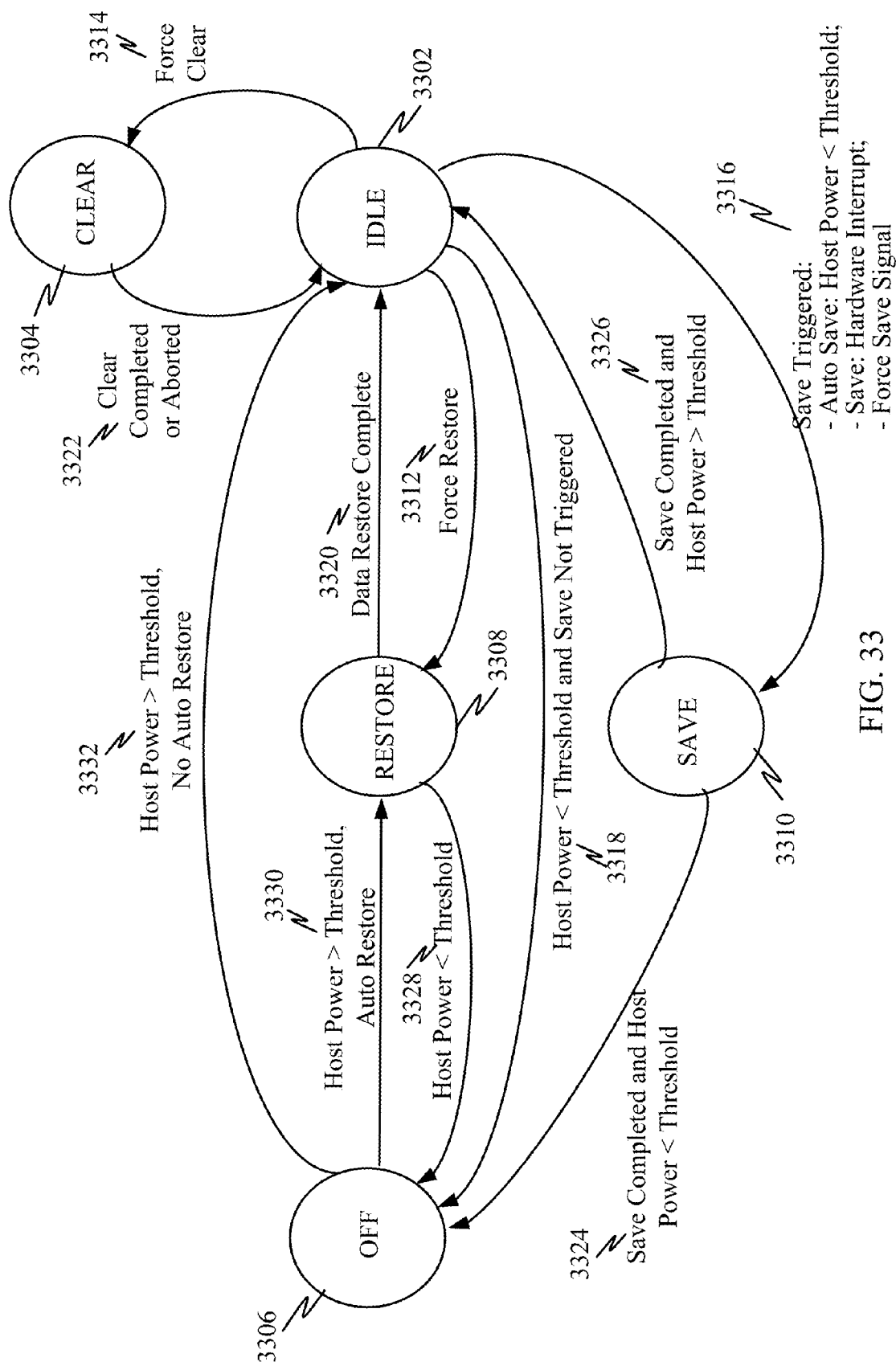
FIG. 33 illustrates an alternative state diagram that may be implemented in a memory module to backup data upon detection of an external triggering event.

FIG. 33 illustrates an alternative state diagram that may be implemented in a memory module to backup data upon detection of an external triggering event (e.g., power failure, hardware signal, host system command, etc.). In one example, the state diagram may be implemented by the backup/restore logic device 222 of the memory module 200. The state diagram of FIG. 33 may comprise five states Save, Restore, Clear, Idle, and Off. In order to perform a Save or Restore operation, the controller (e.g., logic device 222 in FIG. 2) on the memory module may isolate the memory module from the host system (host memory bus) through a set of bus switches for both data and command/address signals. The controller may then cause data transfers between the volatile memory and non-volatile memory. The Clear operation may not require the memory module to be isolated from the host memory system. The isolation of the memory module from the host memory bus ensures a robust backup operation, preventing conflicts with other host memory bus operations. While a Save or Restore operation is being performed, the host system does not have access to the memory module. All operations by the host system on the memory bus targeting the memory module will be ignored. Once the operation is complete, the controller puts the memory module in Self-Refresh and reconnects the memory module back to the host system interface, provided that host system power/voltage is above operating threshold. When control transitions to the memory module, the host system may place the memory module in Self-Refresh mode before a Save or Restore operation (between volatile and non-volatile memory) is initiated by the memory module. The controller may place memory module back in Self-Refresh mode after the Save or Restore operation is completed and before the memory module is reconnected to the host memory bus. In one example, the host system may check over an inter-integrated circuit (i2c) interface to see if the module is in the Idle state before attempting to access the memory module again after a Save or Restore operation has been performed.

Any time the host system power or voltage is below the threshold voltage, the memory module controller either disconnects or does not reconnect the memory module to the host memory bus and the memory module will be in Power_Fail_Mode. The host system can check the memory module's controller status registers through its i2c interface to know if the memory module is available, busy performing a Save or Restore operation, and/or in Power_Fail_Mode. While the memory module is busy, all memory bus traffic including refresh commands to the memory module is ignored. All volatile memory refresh requirements are handled by the on-module controller during Save or Restore operations. On Die Termination (ODT) may also not be operating on the memory module while the host memory bus is disconnected, so system signal quality analysis should take this into account. Test reads by the host system to the memory module to check availability are not recommended since the memory bus will be tri-stated on the memory module.

Under normal operation, the controller is in an idle state 3302 which include may include checking for a triggering event or condition (e.g., low-voltage, hardware signal, software interrupt, etc.). For example, the memory module may monitor for (or receive an indicator of) an external triggering event (e.g., a low voltage, loss of power event, etc.). In one example, a host system may generate an indicator of a triggering event. Such indicator is received, monitored, and/or obtained by the memory module. In the idle state 3302, the memory module may be adapted to: force a memory restore operation 3312, force a memory clear operation 3314, initiate a save operation based on a detected triggering event 3316, and/or power off without saving 3318.

When forcing the memory Restore operation 3312, the memory module may enter a restore state 3308. In this restore state 3308, data may be restored from non-volatile memory to volatile memory and, upon completion of data restoration 3320, the memory module returns to the idle state 3302.

When forcing the memory Clear operation 3314, the memory module may enter a clear state 3304. In this clear state 3304, data may be cleared from non-volatile memory and/or volatile memory. Upon completion or abortion 3322 of the data Clear operation, the memory module returns to the idle state 3302. However, if the host power has dropped below a threshold level 3328, then the memory module may enter the off state 3306 instead.

In some instances, such as when a host power drops below threshold level and a Save operation is not triggered 3318, the memory module may transition directly from the idle state 3302 to an off state 3306. In other instances, the memory module, while in idle state 3302 may detect a triggering event (e.g., auto save—host power less than threshold level, hardware interrupt, and/or force save signal) which causes it to enter a save state 3310. In the save state 3310, the memory module saves 3316 data from the volatile memory to the non-volatile memory. Upon completion of the save operation and if the host power is less than a threshold level 3324, the memory module enters the off state 3306. Otherwise, upon completion of the save operation and if the host power is greater than a threshold level 3326, the memory module returns to the idle state 3302.

From the off state 3306, if the host power is greater than the threshold level 3330, then the memory module may enter the restore state 3308 where data is restored from the non-volatile memory to the volatile memory. Alternatively, if no restore operation is to be performed (e.g., no data was stored upon entering the off state), then if host power is greater than the threshold level 3332, the memory device transitions directly from the off state 3306 to the idle state 3302.

Save Operation Triggers

There may be several available triggers that prompt a memory module controller or logic device to initiate a Save operation. For example, three SAVE triggers may include a power failure, the setting of an i2c interface Force_Save bit by the host system, and the setting of a SAVE_n hardware interrupt pin.

Save Trigger 1: Automatic save in the event of power failure. In order to automatically save or backup the volatile memory if a system power failure is experienced, an on-module voltage monitor may immediately alert the controller or logic device if the main host power or voltage goes below a set threshold. The controller then automatically initiates a Save operation. When the monitor observes a host power or voltage level that is less than the threshold, the host system power will likely not be available while all of the data is being transferred. Therefore, the Save operation is completed while the memory module power is held up by an attached capacitor. This ensures the integrity of the data while it is still in volatile memory and provides the power needed for the data transfer to be completed. The controller quickly isolates the host memory bus after the Save operation is triggered and begins the data transfer from the volatile memory to the non-volatile memory. This trigger may be enabled by default, defined by an Auto_Save bit being set in a register.

Save Trigger 2: The host system may force a Save operation through an i2c control register interface. The host system may prompt the memory module controller to initiate a Save operation through the i2c interface any time that the controller is in the Idle state. The host system only sets the Force_Save bit in the i2c host control registers to start the Save process. After the controller reads the bit as set, it will start the Save operation and clears the bit. This controller status can be checked in the i2c status registers.

Save Trigger 3: The host system may also force a Save operation by driving a hardware interrupt pin (e.g., SAVE_n hardware interrupt pin) to force the memory module controller to initiate a Save operation. The hardware interrupt pin may be driven asynchronously, but may be sampled at the rising memory bus clock edge. In one example, the hardware interrupt pin may be driven low for a minimum of 10 ns or 2 memory clock periods, whichever is more. The controller can mask the hardware interrupt by setting an i2c interface bit (Ignore_HW_Int) so that the hardware interrupt pin will not trigger the Save operation. Once triggered, the Save operation completes a full backup of data from volatile memory into non-volatile memory on the memory module. When the SAVE operation is completed and power is stable, the controller may resume monitoring the state of this hardware interrupt pin.

Restore Operation Triggers

There may be multiple triggers that cause the memory module controller or logic device to initiate a Restore operation. For example, a Restore operation may be automatically triggered upon power-up (from a power failure event) or may be triggered when a restore bit is set (e.g., an i2c interface Force_Restore bit is set).

Restore Trigger 1: If data is saved in non-volatile memory due to a power failure event, it may be automatically restored to volatile memory when adequate power levels resume. The memory module can do this automatically as soon as the host power is stable. If an Auto_Restore host configuration option is enabled, after power-up the controller can isolate the memory module from the host memory bus (at least isolate the data, address, and/or control lines of the host memory bus) and perform a Restore operation.

Restore Trigger 2: The host system may prompt the memory module controller to initiate a Restore operation by using the i2c interface when the controller is in the Idle state. To start the Restore process, the host system may set the Force_Restore bit in the i2c interface (e.g., in a host system control register). After the memory module controller (logic device) reads the bit as set, it can start a Restore operation and then clear the bit. The controller status can be checked in the i2c status registers.

Clear Operation

The Clear operation may provide the host system a way to overwrite the stored contents of the non-volatile memory. The intent of a Clear operation is to erase all data that was previously saved to the non-volatile memory from the volatile memory. Since the Clear operation writes to all of the non-volatile memory, it may take considerably longer than a typical Save operation. Therefore, Clear operations during a Power_Fail_Mode may not be supported since it may take more power than is available on an on-module capacitor that provides backup power. If the memory module changes into Power_Fail_Mode during a Clear operation, the Clear operation may be aborted. Should a Save or Restore operation be triggered while a Clear operation is being performed, the Clear operation may be aborted and the Save or Restore operation may be initiated. While a Clear operation is being performed, the host system may still have access to the memory module and the host system memory bus is not isolated. The host system may check over the i2c interface to see if the Clear operation finished. When a Clear operation has been successfully completed, the memory module controller may set the read-only status bit, Clear_Complete. This bit may be cleared when the next Save operation is initiated.

Module Power Up and Initialization

When first supplying host system power to the memory module, normal power sequencing processes for the memory module can be followed. However, the memory module may require time to initialize before certain functions are available. The time required depends on whether the memory module controller automatically performs a Restore operation when host system power resumes. That is, when a Restore operation is performed upon power up, it may take longer for certain memory module functions are available to the host system. In the case that a Restore process is performed before the host system is given access, the memory module controller may initialize the memory.

Memory Module SuperCapacitor Status

The memory module may monitor the status and regularly check the health of the on-module capacitor (supercapacitors) used as backup power. The capacitor(s) may begin charging as soon as host system power becomes available. When the charge on the capacitor(s) is sufficient to support a full Save operation, the Data_Safe bit may set (e.g., in an i2c interface status register). Generally, depending on the memory module density, a capacitor capacity, and other factors, this process may take less time than approximately one minute.

Example Configurations of Memory Module with Backup Power Source

Figure 5:
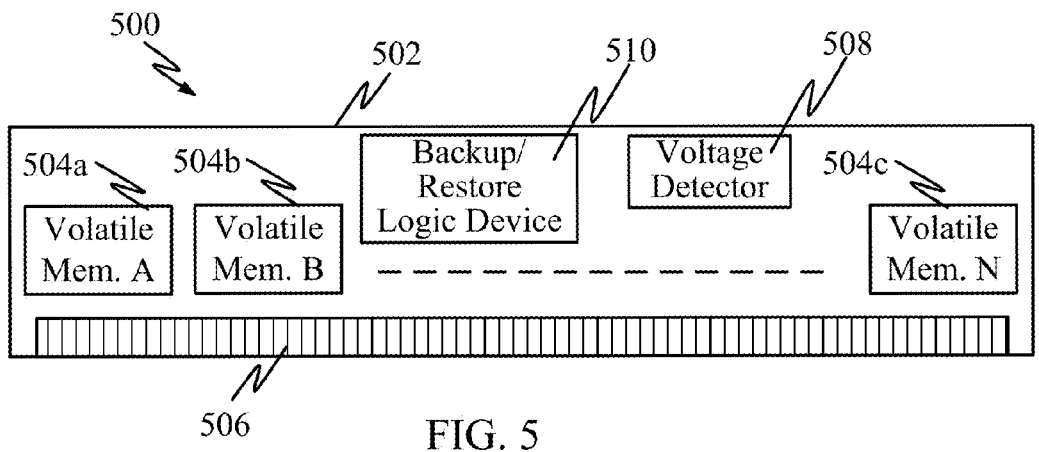
FIG. 5 illustrates one example of a first side view of a memory module incorporating a backup power source and configured to store data from volatile memory to non-volatile memory in a low voltage or loss of external power event.
Figure 6:
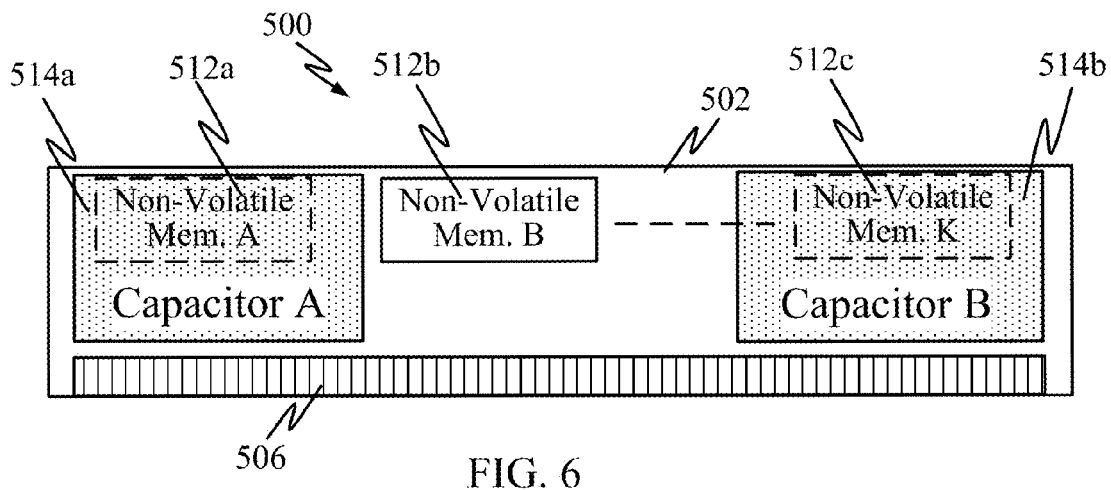
FIG. 6 illustrates one example of a second side view of a memory module incorporating a backup power source and configured to store data from volatile memory to non-volatile memory in a low voltage or loss of external power.
Figure 7:
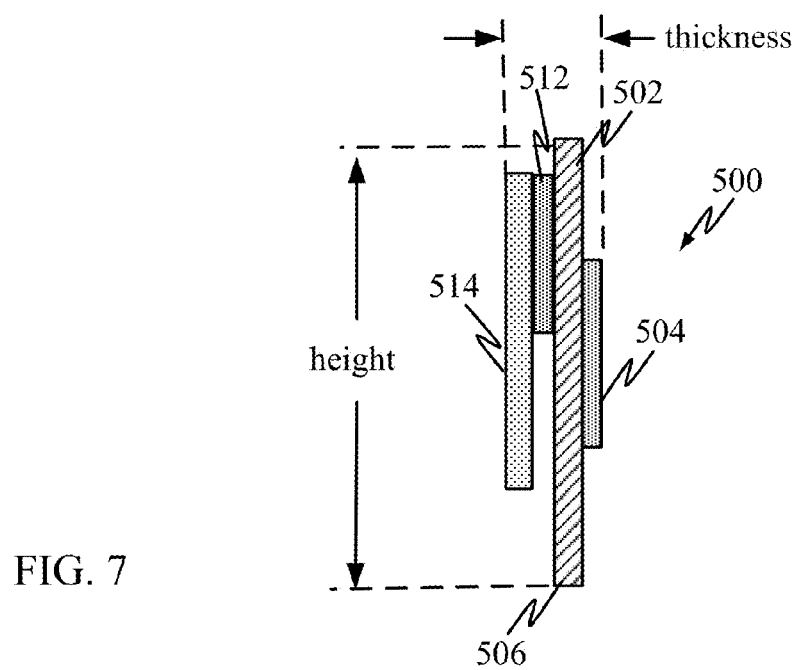
FIG. 7 illustrate one example of a side view of a memory module incorporating a backup power source and configured to store data from volatile memory to non-volatile memory in a low voltage or loss of external power.

FIGS. 5, 6, and 7 illustrate one example of a first side, a second side, and a side view, respectively, of a memory module 500 incorporating a backup power source and configured to store data from volatile memory to non-volatile memory in a low voltage or loss of external power event FIG. 5 illustrates a first side of the memory module 500 including a substrate 502 having a plurality of volatile memory devices 504a, 504b, 504c mounted thereon. The substrate 504 may include a connection edge 506 having a plurality of electrical interconnects to couple the memory module 500 to a host bus. In this example, the first side of the substrate 502 may also include a voltage detector 508 and a backup/restore logic device 510. The voltage detector 508 may monitor an external voltage (e.g., provided by an external power source via the connection edge 506) to determine if and when a low voltage or power loss event occurs. The backup/restore logic device 510 may operate to copy data from volatile memory 504 to non-volatile memory 512 (FIG. 6) if a low voltage or power loss event is detected. When an external power source again provides a normal voltage level, the backup/restore logic device 510 may operate to copy the backed up data from the non-volatile memory 512 to the volatile memory 504.

FIG. 6 illustrates a second side of the memory module 500 having a plurality of non-volatile memory devices 512a, 512b, 512c mounted thereon. In one example, the non-volatile memory 512 may be implemented as an embedded Serial Advance Technology Attachment (SATA) flash drive. The second side of the substrate 502 may also include one or more super-capacitors 514a and 514b that operate as a backup power source when a low voltage or power loss event is detected, thereby allowing time for data to be copied from the volatile memory 504 to the non-volatile memory 512. The super-capacitors 514a and 514b may be charged when external power is available (e.g., via the connection edge 506). The size and/or value of the super-capacitors 514a and 514b may selected to provide sufficient power and time for copying data from the volatile memory 504 to the non-volatile memory 512. Generally, the term "super-capacitor" refers to very high value capacitors (usually with an energy density greater than or equal to 0.5 Wh/kg). Alternatively, ultracapacitors or electrochemical double layer capacitors may also be utilized. In the event of power failure, the super-capacitors 514 may holdup power supplied to the memory module 500 long enough to store data from the volatile memory 504 to the non-volatile memory 512. The power supplied by the super-capacitors 514 may sustain the memory module 500 for up to several seconds (e.g., 1 to 20 seconds) in the event of a system power failure. This may be an adequate sustain time to perform complete transfer of data from the volatile memory 504 to the non-volatile memory 514. The size of the super-capacitors 514 may depend on the size or capacity of the volatile memory devices 504 being backed up and how quickly they need to be backed up to avoid data loss. For instance, in some implementations, each super-capacitor 514 may be from one (1) or two (2) Farad up to thirty (30) Farads or more.

FIG. 7 illustrates a side view of the memory module 500. As can be perceived, the super-capacitors 514 may be mounted just above the non-volatile memory modules 512. In one example, the super-capacitors 514 may have a flat rectangular hexahedron shape often referred to as "prismatic" so as to make the dimension of the memory module 500 thinner.

In one example, the memory module 500 may be a Joint Electron Device Engineering Council (JEDEC) Edge Compatible DDR2-533 512 megabytes registered dual in-line memory module (DIMM) with error-correcting code (ECC) which may be based on 9×8 volatile memory devices or 5×16 volatile memory devices. The memory module 500 may have a standard low-profile (LP) form factor of approximately 8 millimeters (mm) thick and/or approximately 30.0 mm in height.

Figure 8:
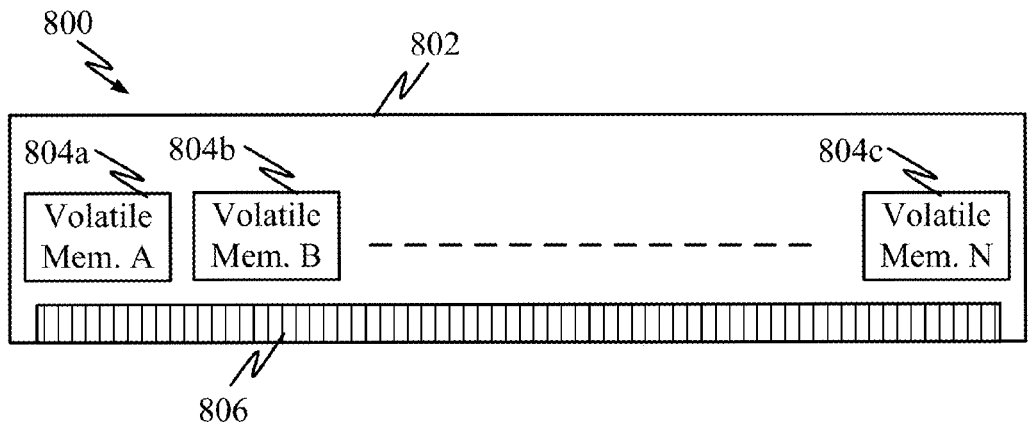
FIG. 8 illustrates another example of a first side view of a memory module incorporating a backup power source and configured to store data from volatile memory to non-volatile memory in a low voltage or loss of external power event.
Figure 9:
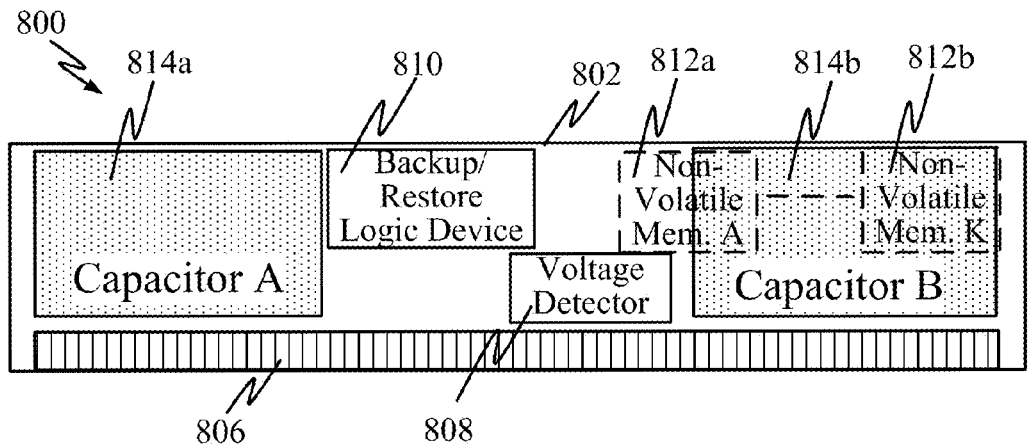
FIG. 9 illustrates another example of a second side view of a memory module incorporating a backup power source and configured to store data from volatile memory to non-volatile memory in a low voltage or loss of external power event.
Figure 10:
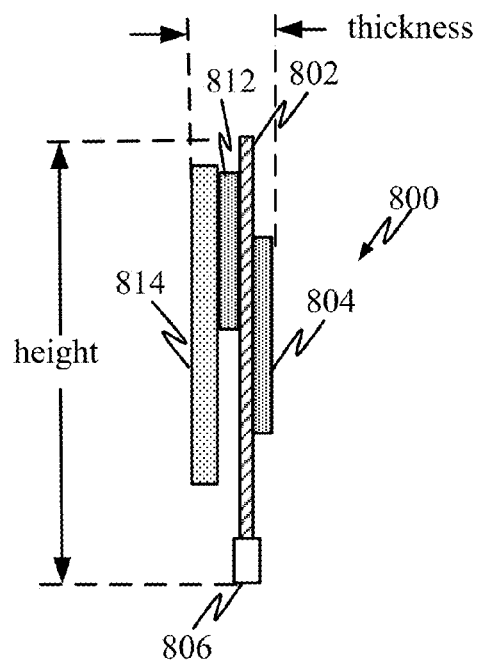
FIG. 10 illustrates another example of a side view of a memory module incorporating a backup power source and configured to store data from volatile memory to non-volatile memory in a low voltage or loss of external power event.

FIGS. 8, 9, and 10 illustrate another example of a first side, a second side, and a side view, respectively, of a memory module 800 incorporating a backup power source and configured to store data from volatile memory to non-volatile memory in a low voltage or loss of external power event.

FIG. 8 illustrates a first side of the memory module 800 including a substrate 802 having a plurality of volatile memory devices 804a, 804b, 804c mounted thereon. In this example, the substrate 804 may be a thin substrate, such as a film. The substrate 802 may include a connection edge 806 having a plurality of electrical interconnects to couple the memory module 800 to a host bus. Because a thin substrate is being utilized, the connection edge 806 may be thicker than the substrate 802.

FIG. 9 illustrates a second side of the memory module 800 having a plurality of non-volatile memory devices 812a, 812b mounted thereon. In one example, the non-volatile memory 812 may be implemented as an embedded Serial Advance Technology Attachment (SATA) flash drive. The second side of the substrate 802 may also include one or more super-capacitors 814a and 814b that operate as a backup power source when a low voltage or power loss event is detected, thereby allowing time for data to be copied from the volatile memory 804 to the non-volatile memory 812.

In this example, the second side of the substrate 802 may also include a voltage detector 808 and a backup/restore logic device 810. The voltage detector 808 may monitor an external voltage (e.g., provided by an external power source via the connection edge 806) to determine if and when a low voltage or power loss event occurs. The backup/restore logic device 810 may operate to copy data from volatile memory 804 to non-volatile memory 812 if a low voltage or power loss event is detected. When an external power source again provides a normal voltage level, the backup/restore logic device 810 may operate to copy the backed up data from the non-volatile memory 812 to the volatile memory 804.

FIG. 10 illustrates a side view of the memory module 800. As can be perceived, the super-capacitors 814 may be mounted just above the non-volatile memory modules 812. In this example, the substrate 802 may be thinner than the edge connector 806.

In one example, the memory module 800 may be a Joint Electron Device Engineering Council (JEDEC) Edge Compatible DDR3-1066 1 Gigabyte/2 Gigabyte registered DIMM with error-correcting code (ECC) which may be based on 9×8 volatile memory devices (1 Gigabyte or 2 Gigabyte). The memory module 800 may have a standard low-profile (LP) form factor of approximately 7.55 millimeters (mm) thick and/or approximately 30 mm in height.

Figure 11:
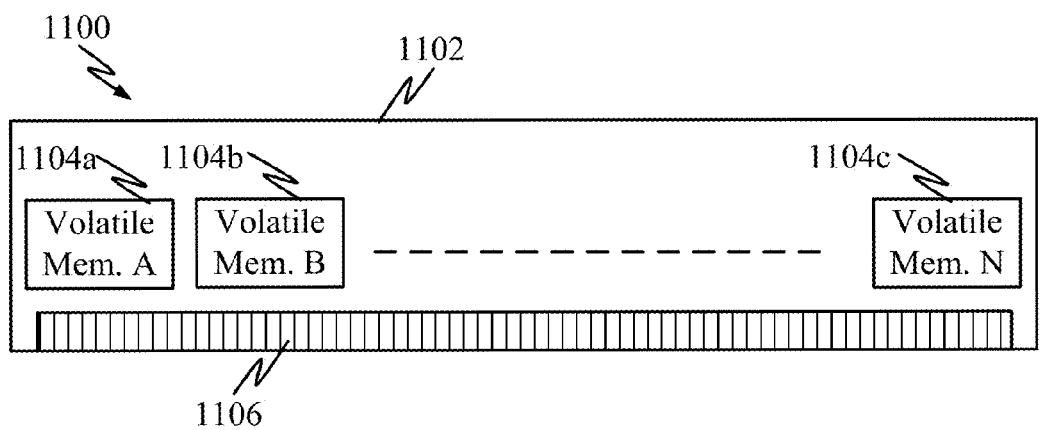
FIG. 11 illustrates another example of a first side view of a memory module incorporating a backup power source and configured to store data from volatile memory to non-volatile memory in a low voltage or loss of external power event.
Figure 12:
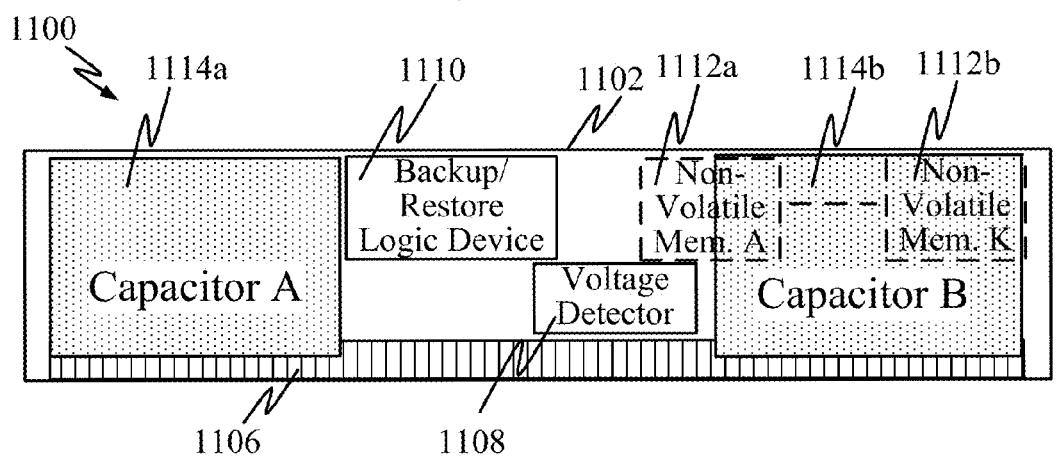
FIG. 12 illustrates another example of a second side view of a memory module incorporating a backup power source and configured to store data from volatile memory to non-volatile memory in a low voltage or loss of external power event.
Figure 13:
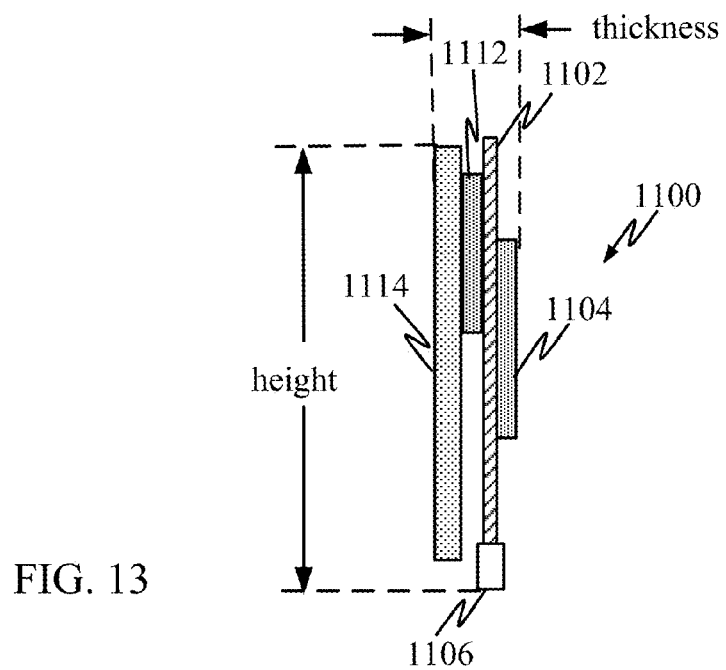
FIG. 13 illustrates another example of a side view of a memory module incorporating a backup power source and configured to store data from volatile memory to non-volatile memory in a low voltage or loss of external power event.

FIGS. 11, 12, and 13 illustrate another example of a first side, a second side, and a side view, respectively, of a memory module 1100 incorporating a backup power source and configured to store data from volatile memory to non-volatile memory in a low voltage or loss of external power event.

FIG. 11 illustrates a first side of the memory module 1100 including a substrate 1102 having a plurality of volatile memory devices 1104a, 1104b, 1104c mounted thereon. In this example, the substrate 1104 may be a thin substrate, such as a film. The substrate 1102 may include a connection edge 1106 having a plurality of electrical interconnects to couple the memory module 1100 to a host bus. Because a thin substrate is being utilized, the connection edge 1106 may be thicker than the substrate 1102.

FIG. 12 illustrates a second side of the memory module 1100 having a plurality of non-volatile memory devices 1112a, 1112b mounted thereon. In one example, the non-volatile memory 1112 may be implemented as an embedded Serial Advance Technology Attachment (SATA) flash drive. The second side of the substrate 1102 may also include a backup/restore logic device 1110 and one or more super-capacitors 1114a and 1114b that operate as a backup power source when a low voltage or power loss event is detected, thereby allowing time for data to be copied from the volatile memory 1104 to the non-volatile memory 1112 by the backup/restore logic device 1110.

FIG. 13 illustrates a side view of the memory module 1100. As can be perceived, the super-capacitors 1114 may be mounted just above the non-volatile memory modules 1112. In this example, the substrate 1102 may be thinner than the edge connector 1106. Additionally, due to the low height of the memory module 1100, the super-capacitors 1114 may extend along a substantial length of the height of the substrate 1102 and into the area of the connection edge 1106.

In one example, the memory module 1100 may be a Joint Electron Device Engineering Council (JEDEC) Edge Compatible DDR3-1333 4 Gigabyte registered DIMM with error-correcting code (ECC) which may be based on eighteen 2 Gigabyte×8 volatile memory devices (dynamic RAM) packaged in 2-high stacks (2R×8 module). The memory module 1100 may have a standard low-profile (LP) form factor of approximately 10.5 millimeters (mm) thick and/or approximately 27.5 mm in height.

Figure 14:
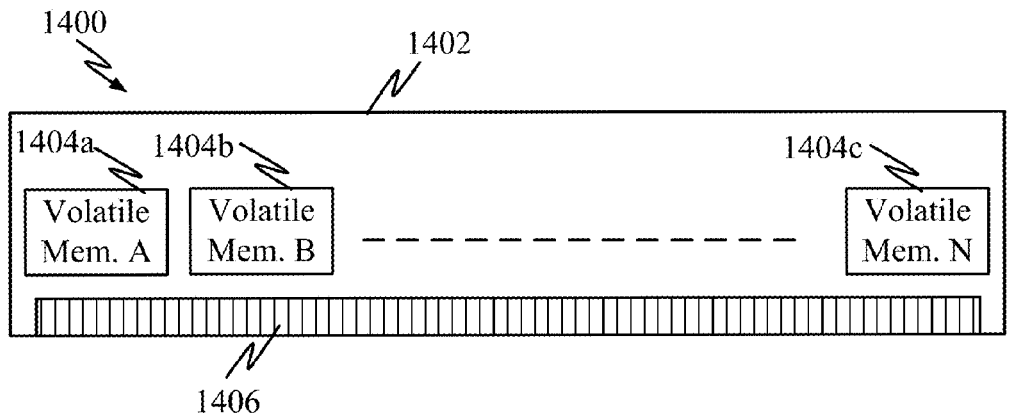
FIG. 14 illustrates yet another example of a first side view of a memory module configured to store data from volatile memory to non-volatile memory in a low voltage or loss of external power event.
Figure 15:
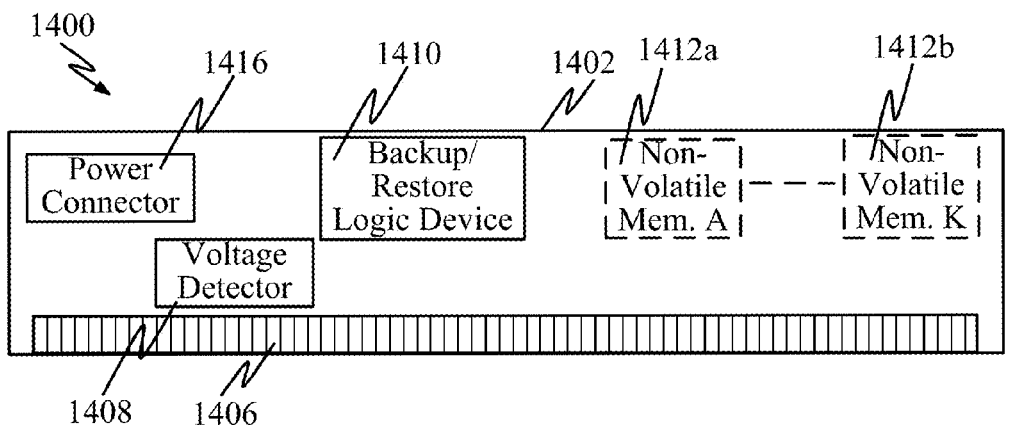
FIG. 15 illustrates yet another example of a second side view of a memory module configured to store data from volatile memory to non-volatile memory in a low voltage or loss of external power event.
Figure 17:
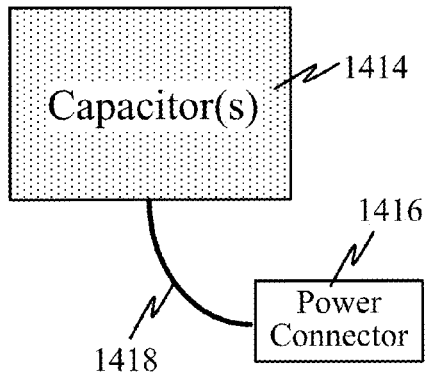
FIG. 17 illustrates yet another example of a partial system view of a memory module configured to store data from volatile memory to non-volatile memory in a low voltage or loss of external power event.
Figure 16:
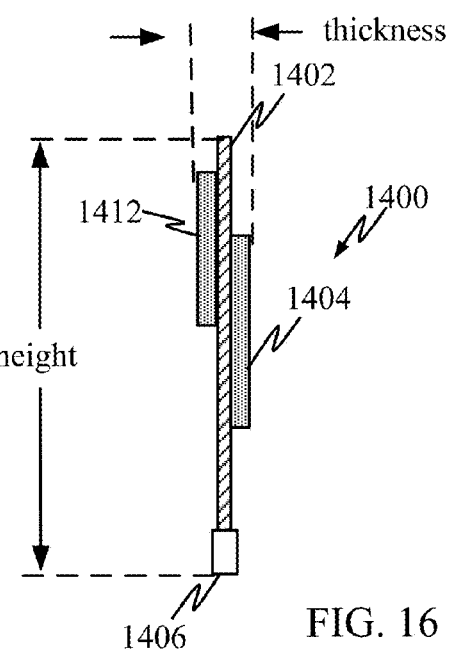
FIG. 16 illustrates yet another example of a side view of a memory module configured to store data from volatile memory to non-volatile memory in a low voltage or loss of external power event.

FIGS. 14, 15, 16, and, 17 illustrate yet another example of a first side, a second side, a side view, and partial system view, respectively, of a memory module 1400 configured to store data from volatile memory to non-volatile memory in a low voltage or loss of external power event. Like previous examples, the memory module 1400 may include a substrate 1402 having a plurality of volatile memory devices 1404a, 1404b, 1404c mounted on a first side and a plurality of non-volatile memory devices 1412a, 1412b mounted on a second side. The memory module 1400 may also include a voltage detector 1408 and a backup/restore logic device 1410. A connection edge 1406, may have a plurality of electrical interconnects to couple the memory module 1400 to a host bus.

In contrast to previous examples, the memory module 1400 may include a power connector 1416 that allows charging and/or discharging of an external backup power capacitor 1414 through a wire or other conductor 1418.

The concepts and/or configurations described herein may be implemented in memory modules of different physical dimensions and capacities including, Ultra-Small Backup DIMM, Low Height Backup Module, Standard Mini DIMM, and Standard Low Profile DIMM. In one example, the memory module may be an Ultra-Small DIMM with ECC having an approximate dimension of 60 mm wide and 30 mm high. In another example, the memory module may be an Ultra-Small DIMM with ECC having an approximate dimension of 60 mm wide and 30 mm high.

Figure 18:
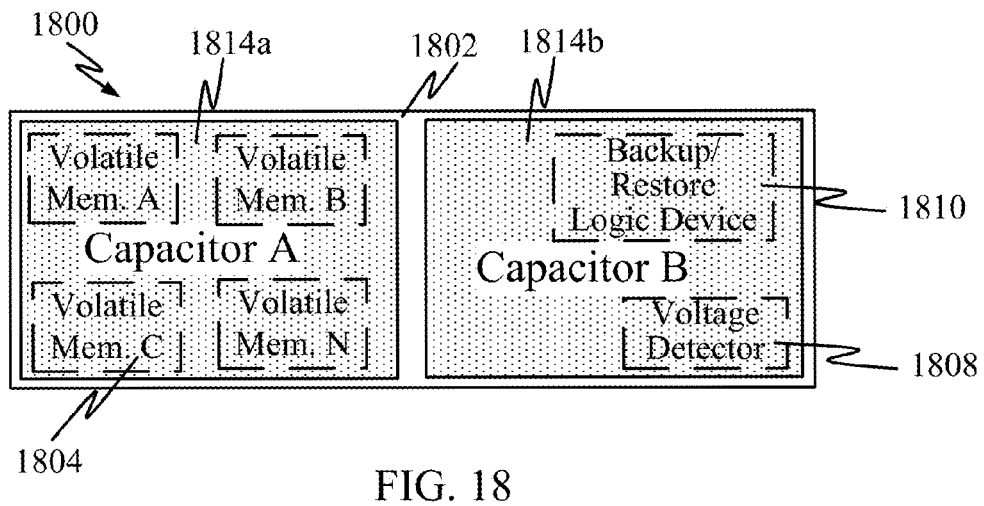
FIG. 18 illustrates yet another example of a first side view of a memory module configured to store data from volatile memory to non-volatile memory in a low voltage or loss of external power event.
Figure 19:
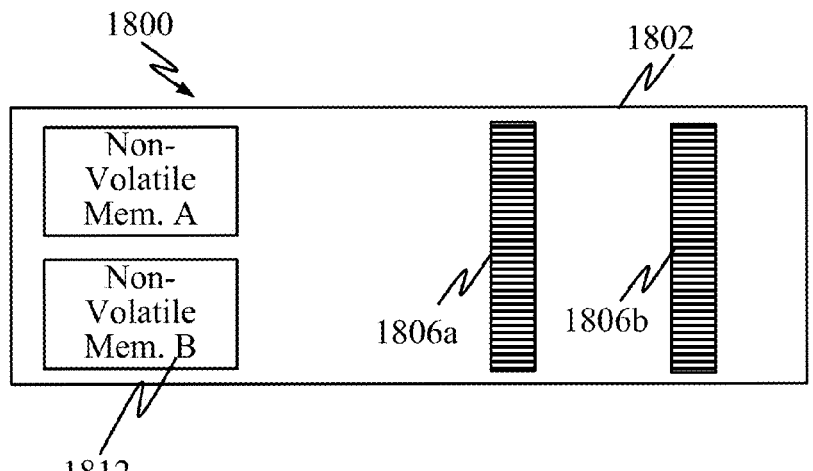
FIG. 19 illustrates yet another example of a second side of a memory module configured to store data from volatile memory to non-volatile memory in a low voltage or loss of external power event.
Figure 20:
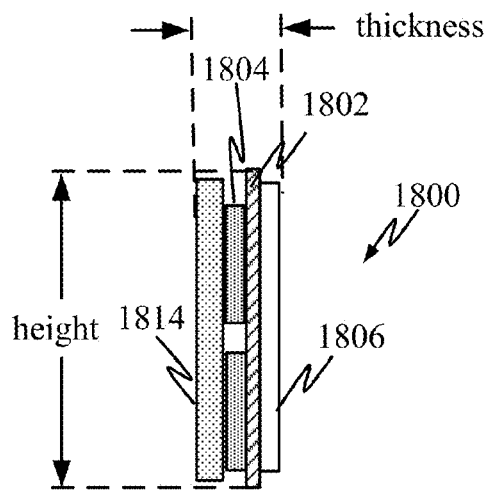
FIG. 20 illustrates yet another example of a side view of a memory module configured to store data from volatile memory to non-volatile memory in a low voltage or loss of external power event.

FIGS. 18, 19, and 20 illustrate yet another example of a first side, a second side, and a side view, respectively, of a memory module 1800 configured to store data from volatile memory to non-volatile memory in a low voltage or loss of external power event. Like previous examples, the memory module 1800 may include a substrate 1802 having a plurality of volatile memory devices 1804 mounted on a first side and a plurality of non-volatile memory devices 1812 mounted on a second side. The memory module 1800 may also include a voltage detector 1808 and a backup/restore logic device 1810. In contrast to previous examples, this memory module 1800 does not have a connection edge. Instead, the memory module 1800 may include one or more connectors 1806a and 1806b to connect the memory module to a host system. The memory module 1800 may be utilized, for example, in embedded application with low height requirements. In one example, the memory module 1800 may be approximately 74 mm wide and approximately 26 mm high and between 5 mm and 11 mm thick.

In the examples illustrated in FIGS. 5-20, the triggering event is considered a low voltage or loss of external power event. However, it should be clear that other triggering events, such as an external hardware signal or a command from a host system, are possible and contemplated triggering events.

In some implementations, the memory modules illustrated in FIGS. 2-20 may be implemented for caching information (e.g., temporary storage) in such implementations as RAID systems. For instance, one or more of these memory modules may be coupled to a RAID controller and utilized by the RAID controller for caching data.

Fast Startup Technique

After an external power source reestablishes a normal voltage, data in non-volatile memory can be restored to volatile memory. In some implementations, this restoration process may take a few seconds (e.g., 4 to 10 seconds) depending on the size or capacity of the volatile memory. For instance, it may take approximately 8 seconds for a 512 MB DIMM memory module. While restore operations take place, the memory module may not be accessible to a host. In most cases, this should not be a problem since the restore operation should be completed long before the host has completed boot up of its operating system. However, if the non-access period (e.g., 8 second) is a problem for some host systems (e.g., the host wants immediate access to the memory module), a hybrid approach may be employed using non-volatile memory for data backup with a small battery (e.g., smaller than the batteries used by the prior art).

That is, a small auxiliary battery may be utilized to support immediate accessibility to the memory module after a host system powers up. The data in the volatile memory device of the memory module may have been saved in non-volatile memory for long term backup (e.g., prior to a power failure). The small auxiliary battery may provide power to one or more components of the memory module during this period when the host system has not yet powered up. A restore operation may be initiated prior to the host system powering up in one of two ways. First, the operator may depress a pushbutton on memory module to wakeup components of the memory module and copy data from non-volatile memory back to volatile memory. Second, a dedicated hardware signal (e.g., defined by the host system) may be used to initiate the restore operation on the memory module. For instance, such dedicated hardware signal may be driven by "out-of-band" system management hardware to support fully remote system operations.

Super-Capacitor in Memory Modules

Note that the use of super-capacitor described in various examples herein have several advantages over prior art that utilizes batteries to backup data in volatile memory. First, using the non-volatile memory to backup data allows long-term data storage (e.g., months or years). By contrast, the prior art may utilize batteries to maintain data in volatile memory, but this only allows maintaining data for just a few hours or days (e.g., 72 hours). Consequently, the present approach allows data to be retained, backed up or stored long term relative to the prior art.

Second, the present approach of using one or more super-capacitors (as the backup power source) allows recharging within a few seconds (e.g., 10 seconds or less) while the use of rechargeable batteries in the prior art typically takes several hours (e.g., 8 hours) to recharge.

Third, the use of super-capacitors makes the overall size and/or weight of the memory module smaller or lighter than if batteries were used. Note that the heavier the module, the greater the chance of failure at the interconnect point (e.g., socket) with the host system.

Fourth, with super-capacitors, backup and restore capabilities are always available to the memory module. By contrast, if rechargeable batteries are used, these batteries must be regularly conditioned by discharging them periodically. Consequently, the cache memory module must be taken off line for such procedure, affecting its availability and backup performance.

Fifth, super-capacitors can operate with replacement while batteries must be periodically replaced. This replacement of batteries adds to the operating and maintenance cost of prior art memory modules.

Sixth, batteries tend to have a higher initial cost than capacitors and also have ongoing costs for periodic maintenance or replacement.

Seventh, the use of super-capacitors as a backup power source is more environmentally friendly than using batteries since, unlike batteries, super-capacitors do not have to be regularly replaced.

Example Backup Power Source Circuit

Figure 21:
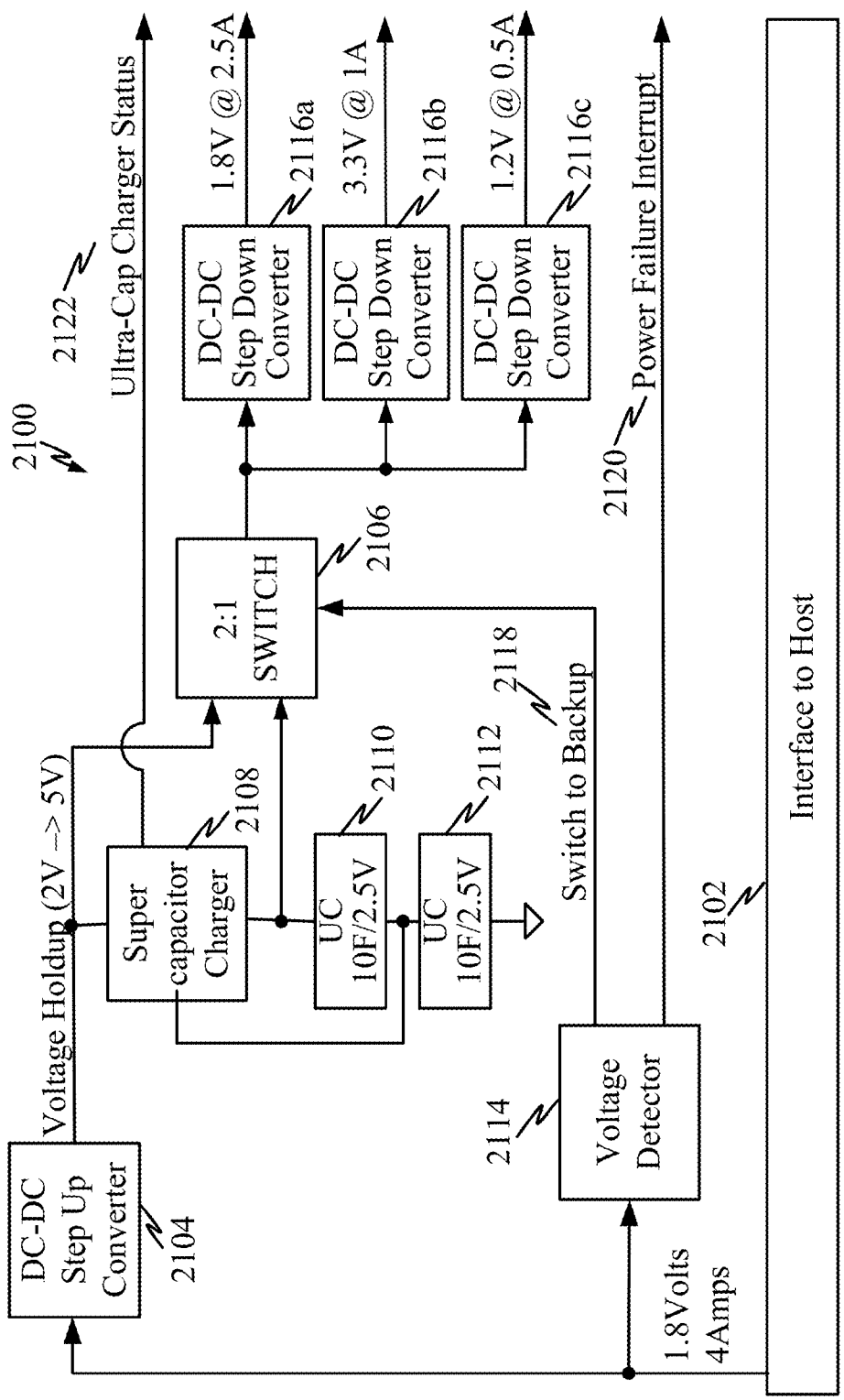
FIG. 21 is a block diagram illustrating one example of a power circuit that may be implemented on a memory module to provide power to a memory module.

FIG. 21 is a block diagram illustrating one example of a power circuit 2100 that may be implemented on a memory module to provide power to a memory module. If a triggering event (e.g., a power failure event, hardware signal, host system command, etc.) occurs, the power circuit 2100 may be adapted to temporary provide power to one or more components of the memory module to safely copy data from volatile memory to non-volatile memory. The power circuit 2100 may normally obtain its power from an external power source via an interface to a host (e.g., and edge connector to a bus). In this example, the external power source may provide 1.8 volts at 4 amperes. However, different implementations may provide different voltage and current levels. A step-up converter 2104 may serve to convert the input voltage to a different voltage level (voltage holdup). In normal operation, the switch 2106 may simply couple the output of the step-up converter 2104 to one or more step-down converters 2116 that provide various voltage levels to operate components of the memory module. During normal operation, the output from the step-up converter 2104 may also serve to operate a charger 2108 that charges one or more super-capacitors 2110 and 2112. In this example, the super-capacitors are 10 Farads at 2.5 Volts. The charger 2108 may provides is status (e.g., charge level for super-capacitors 2110 and/or 2112) by a charger status signal 2122 which may be used to determine when/if backup power is available to perform data backup.

The power circuit 2100 may also include a voltage detector 2114 that is configured to sense changes in voltage from the external power source. The voltage detector 2114 may be adapted to determine when the incoming voltage level falls below a voltage threshold which may indicate a power failure or loss. If such power loss event is detected, the voltage detector 2114 may send a signal 2118 to cause the switch 2106 to change its input power from the step-up converter 2104 to the super-capacitors 2110 and 2112. Note that the signal 2118 may be optional as the switch 2106 may perform this automatically upon sensing a lower voltage from the converter 2104. Additionally, the voltage detector 2114 may also generate a power failure interrupt signal 2120. When the power failure interrupt signal 2120 is set, this is an indicator of imminent power failure and can be used by other components (such as a backup/restore controller) of the memory module to quickly copy data from volatile memory to non-volatile memory. Subsequently, when external power is reestablished or again normal, the power failure interrupt signal 2120 may be cleared, thereby indicating that data previously copied to the non-volatile memory can be restored to the volatile memory.

Note that the number, size, and/or value of the super-capacitors 2110 and 2112 may vary depending on how long the backup power source needs to maintain or holdup the components of the memory module and how much power is needed to allow backing up data from volatile memory to non-volatile memory.

Figure 22:
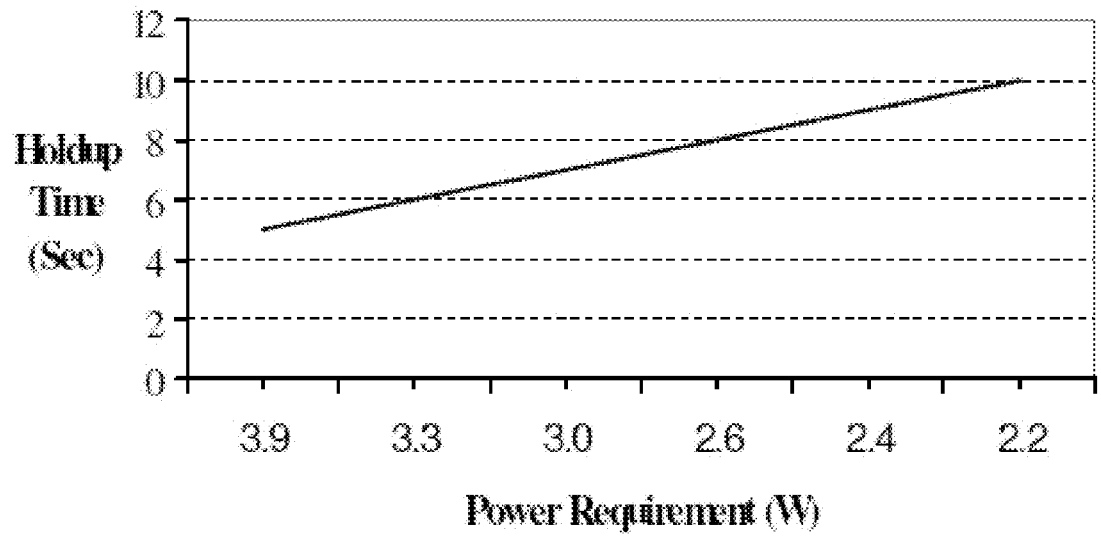
FIG. 22 illustrates an example of the power output for a single ten farad super-capacitor.

FIG. 22 illustrates an example of the power output for a single 10 farad super-capacitor. It can be appreciated that the single 10 farad super-capacitor can provide power for approximately 5 seconds (at approximately 3.9 watts) up to approximately 10 seconds (at approximately 2.2 watts).

Figure 23:
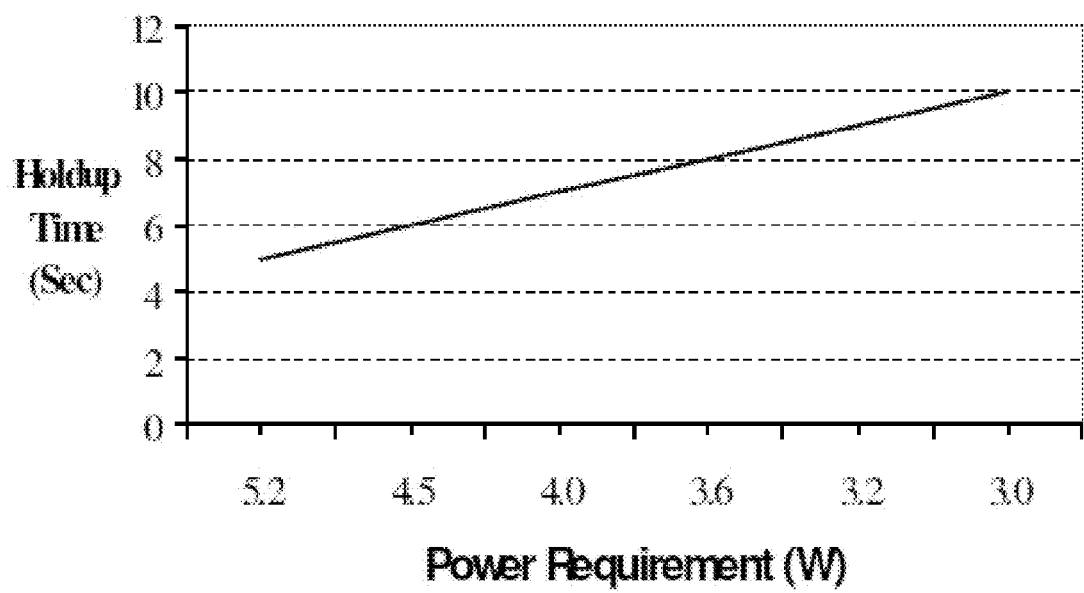
FIG. 23 illustrates an example of the power output for a two ten farad super-capacitors connected in series (as in FIG. 21).

FIG. 23 illustrates an example of the power output for a two 10 farad super-capacitors connected in series (as in FIG. 21). It can be appreciated that the two 10 farad super-capacitors can provide power for approximately 5 seconds (at approximately 5.2 watts) up to approximately 10 seconds (at approximately 3.0 watts).

Smaller or larger capacitors and/or fewer or greater number of super-capacitors may be employed depending on the memory module (e.g., volatile memory capacity) to satisfy the power needed to backup data from volatile memory to non-volatile memory in the event of power loss.

Example Backup and Restore Logic Device

Figure 24:
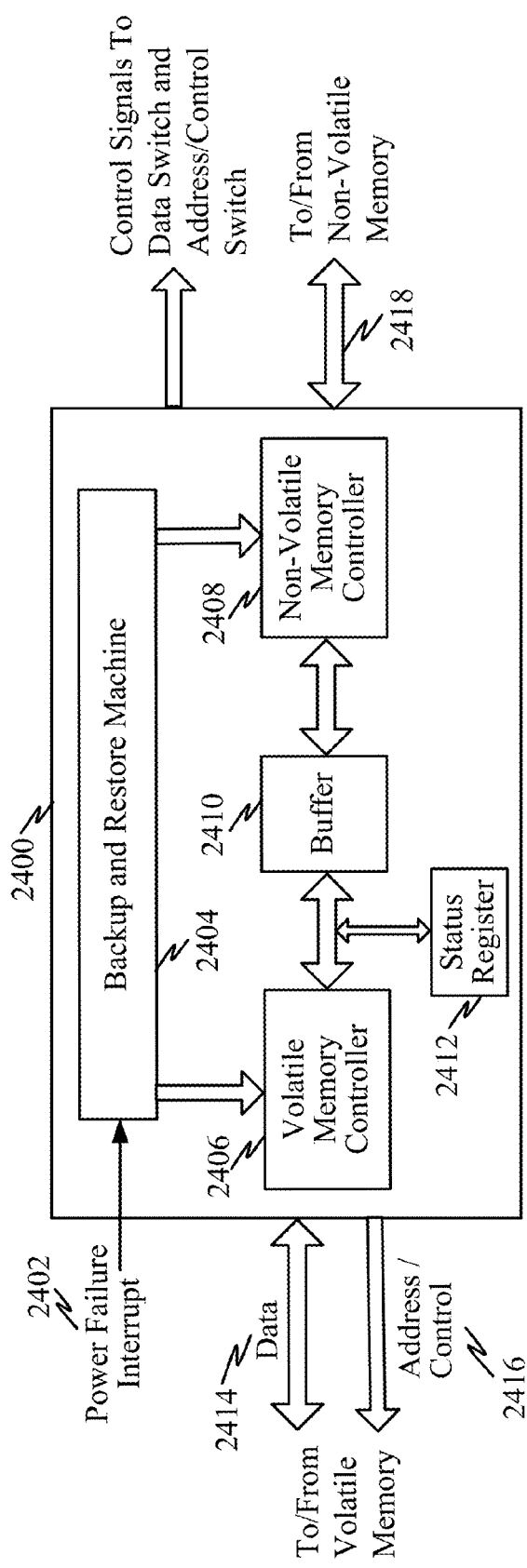
FIG. 24 is a block diagram illustrating one example of the functional modules of a backup and restore controller that may be utilized by a memory module having volatile memory and non-volatile memory.

FIG. 24 is a block diagram illustrating one example of the functional modules of a backup and restore logic device 2400 that may be utilized by a memory module having volatile memory and non-volatile memory. In one implementation, the backup and restore logic device 2400 may be implemented within a processing circuit, controller, application specific integrated circuit (ASIC), switch, Field Programmable Gate Array (FPGA), etc. In one example, the backup and restore logic device 2400 may be the backup/restore logic device 222 of FIG. 2. The logic device 2400 may include various operating modes, including a backup mode and a restore mode. The logic device 2400 may also include or implement a volatile memory controller 2406 and a non-volatile memory controller 2408 to facilitate transfers between volatile memory and non-volatile memory on the memory module.

Upon receiving a power failure interrupt signal 2402 (e.g., indicating imminent loss of power to the memory module), the logic device 2400 may be configured to enter backup mode. In backup mode, the logic device 2400 facilitates data storage from volatile memory into non-volatile memory, thereby preventing data loss in the memory module. The logic device 2400 may implement a state machine 2404 (e.g., using a control circuit, a logic module, etc.) to perform backup and/or restore operations depending on the condition of an external power source. One example of such state machine is illustrated in FIG. 3. Upon entering backup mode, the logic device 2400 may generate one or more signals to cause one or more external switches (e.g., data bus switch 220 and address/control bus switch 218 in FIG. 2) to cause an address/control bus and data bus to be setup between volatile memory and non-volatile memory on the memory module. For example, in FIG. 2, data bus switch 220 and address/control bus switch 218 may be reconfigured to decouple the volatile memory devices 204 from the interface 202 and instead couple the volatile memory devices 204 to the non-volatile memory devices 206. Therefore, in backup mode, the logic device 2400 can retrieve data from the volatile memory via a data bus 2414 and address/control information via an address/control bus 2416. The volatile memory controller 2406 may be adapted to retrieve data from the volatile memory and provide it to a non-volatile memory controller 2408 which stores the data in the non-volatile memory. A buffer 2410 may be placed between the volatile memory controller 2406 and non-volatile memory controller 2408 to temporarily store data being transferred between a first data bus (e.g., data bus 2414) and a second data bus (data bus 2418). In one example, a status register 2412 may also be used to maintain information indicating the state of the logic device 2400 (e.g., SAVE in process, SAVE complete, RESTORE in process, etc.) These status registers 2412 may also allow a host system to configure the operation of the backup and restore logic device 2400.

Note that the sustained write/read speed of the logic device 2400 and/or the non-volatile memory being used may determine save (backup) and/or restore times achieved during backup and/or restore operations between volatile and non-volatile memory.

Upon clearing of the power failure interrupt signal 2402 (e.g., indicating that external power is now available at a normal voltage level), the logic device 2400 may be configured to enter restore mode. In restore mode, the logic device 2400 facilitates data retrieval and storage from non-volatile memory into volatile memory, thereby restoring the data in volatile memory to its original state before the power loss event. In one example, the restore operations may be performed as illustrated in the state machine of FIG. 3.

More generally, the logic device 2400 may be configured to: (a) receive a first indicator of a first external triggering event and (b) copy data from the one or more volatile memory devices to the one or more non-volatile memory devices upon receipt of the first indicator. The first external triggering event may be one of an external power failure, a hardware signal, or a system host command.

In one example, the logic device 2400 may be further configured to: (a) electrically decouple the host system from the one or more volatile memory devices after receiving the first indicator of the first external triggering event; and/or (b) electrically couple the one or more volatile memory devices to the one or more non-volatile memory devices prior to copying the data.

In another example, the logic device 2400 may be further configured to: (a) receive an a second indicator a second external triggering event; (b) restore the data from the one or more non-volatile memory devices to the one or more volatile memory devices based on receipt of the second indicator; (c) electrically decouple the one or more non-volatile memory devices from the one or more volatile memory devices after restoring the data; and/or (d) electrically couple the one or more volatile memory devices to the host system after restoring the data. Note that the second indicator may be indicative that the first indicator has been cleared. In some implementations, the second indicator may be received via a different interface than the first indicator or the second external triggering event may be independent of the first external triggering event.

FIGS. 25, 26, and 27 illustrate different byte registers and how a host system (e.g., RAID controller) may check the status and/or set options for a memory module using these byte registers. In one example, the logic device 2400 may include an inter-integrated circuit (i2c) interface allowing a host system to read the status and setup options for the logic device 2400. The i2c interface, also referred to as I$^2$C, is a multi-master serial computer bus that is often used to attach peripherals to a motherboard, embedded system, or cell phone, for example. In some implementations, a memory module may exchange information with a host system via an i2c interface (e.g., status registers associated with the i2c interface). For example, FIG. 25 may illustrate a Byte 0 of an i2c register, FIG. 26 may illustrate a Byte 1 of the i2c register, and FIG. 27 may illustrate a Byte 5 of the i2c register. The status of the memory module may be updated as needed by the memory module controller or logic device by utilizing such registers.

FIG. 25 (comprising FIGS. 25A and 25B) illustrates how a byte may be used to convey the status of a memory module having backup and restore capabilities. FIG. 25 may illustrate a status register (Byte 0) which may be used by a memory module to convey its status to the host system. Bits 0 and 1 (RDCS) may be used to indicate the state of the memory module (e.g., one of four different states), such as Idle, Clear in progress, Save in progress, and Restore in progress. Bit 1 of this register may be checked by the host system to determine if the memory module is busy with a Save or Restore operation. Bit 2 may indicate whether a save operation was successfully completed (e.g., from volatile memory to non-volatile memory) since the last power cycle or operating system hang. This Bit 2 (Save_Data_Valid) is set to one (1) just after a Save operation is completed. It signifies that the data in non-volatile memory is valid from that Save operation and is ready to be transferred to volatile memory. Once a Restore operation is completed, this Bit 2 is cleared. Bit 2 may be used to help manage the automatic Restore features of the memory module, especially in response to power failure triggers. Bit 2 may also be cleared if a Clear operation is initiated by the host system.

Similarly, Bit 3 (Restore_Complete) may indicate whether a restore operation was successfully completed (e.g., from non-volatile memory to volatile memory) since the last power cycle or operating system hang. Bit 4 (Power_Fail_Mode) may be used to indicate that the memory module detects that a host system power or voltage is below the minimum threshold and the memory module is running off of backup (supercapacitor) power. Bit 5 (Data_Safe) may be utilized to indicate that the memory module backup power (e.g., supercapacitors) are ready to support a full Save operation from volatile memory using only on-module power. Bit 6 (Clear_Complete) may be used to indicate that a Clear operation has been successfully completed. Bit 6 may be cleared when a Save operation is initiated.

FIG. 26 illustrates how a byte may be used to convey configurable options to a memory module having backup and restore capabilities. FIG. 26 may illustrate a register (Byte 1) which may be used by a host system to provide configuration options to a memory module. Bits 0-7 may be read/write bits. Bit 0 (Auto_Save) may be used to setup the memory module to automatically save (e.g., from volatile memory to non-volatile memory) on all power downs versus only saving when it is triggered by a hardware interrupt or software force Save operation. If Bit 0 is cleared to zero, the memory module does not automatically perform a Save operation should the memory module detect a power failure. Bit 1 (Auto_Restore) may be used to indicate that an automatic Restore operation should be performed by the memory module on power up if there was a previously successful Save operation due to power fail. Bit 3 (Ignore_HW_Interrupt) may be used to mask a SAVE_n HW interrupt pin and prevents it from triggering a Save operation. Bit 6 (Disable_Save) may be used to completely disable a Save operation such that Save operation will not be triggered by any of the triggering events (e.g., hardware interrupt, i2c force, power fail). This may be helpful to preserve previously saved data in the memory module non-volatile memory.

FIG. 27 illustrates how a byte may be used by a host system to force operations on the memory module. FIG. 27 may illustrate a register (Byte 5) which may be used by a host system to initiate actions on the memory module. For instance, Bit 0 (Force_Save) may be used by a host system to initiate or force a Save (backup) operation (e.g., from volatile memory to non-volatile memory). Bit 0 may be cleared after the Save operation starts. Similarly, Bit 1 (Force_Restore) may be used by a host system to initiate or force a Restore operation (e.g., from non-volatile memory to volatile memory). Bit 1 may be cleared after the Restore operation starts. Bit 2 (Abort_Save) may cause the memory module controller to immediately attempt to abort a Save operation, if is being performed. Bit 2 may be cleared after it is read and/or before the controller moves into the Idle state from the Save state. If the controller is not currently performing a Save operation, Bit 2 is ignored and cleared. Bit 3 (Restore_Defaults) may be used to restore all memory module configuration options to their default settings. Bit 3 may be cleared after the default configuration is restored. Bit 6 (Force_Clear) may be used to cause all data contents of non-volatile memory to be erased. Bit 6 may be cleared after the process starts. The Clear process may be reported in an i2c status register (RDCS Byte 0, Bits 0-1: 01—CLEAR in progress). The Bit 0 (Force_Clear bit) is ignored and cleared on the next clock cycle if Power_Fail_Mode is set.

According to one implementation, a memory module controller or logic device may be instructed to perform only one operation in a control register at a time. If Force_Save, Force_Restore, Restore_Defaults, or Force_Clear is set, then the controller ignores any further writes to set other control registers until the previous operation is started and the associated bit is cleared. However, the Abort_Save bit (Bit 2 in Byte 5) may be written at any time to abort a Save operation.

Figure 28:
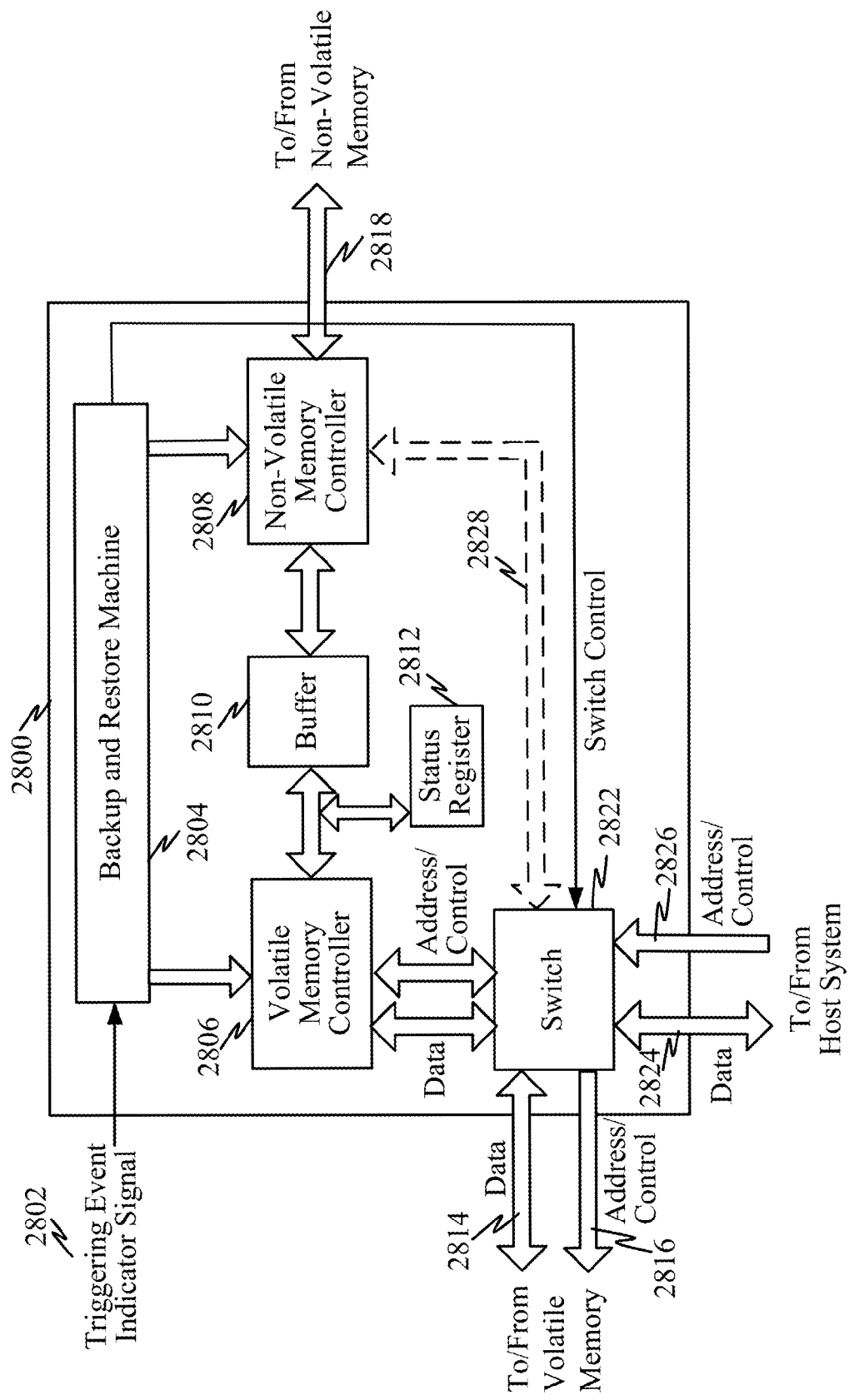
FIG. 28 is a block diagram illustrating another example of the functional modules of a backup and restore controller that may be utilized by a memory module having volatile memory and non-volatile memory.

FIG. 28 is a block diagram illustrating another example of the functional modules of a backup and restore logic device that may be utilized by a memory module having volatile memory and non-volatile memory. In comparison to the logic device 2400 of FIG. 24, this alternative logic device 2800 may further incorporate the functions of a data bus switch and an address/control switch to reduce components on the memory module. The backup and restore logic device 2800 may include a volatile memory controller 2806 and a non-volatile memory controller 2808 to facilitate data transfers between volatile memory and non-volatile memory on the memory module.

In a normal mode of operation, e.g., when power is being provided to the memory module via the external host system, the logic device 2800 may electrically couple a data bus 2824 and/or an address/control bus 2826 to volatile memory via a corresponding data bus 2814 and/or address/control bus 2816. In one example, such electrical coupling may be done by a switch 2822.

Upon receiving a triggering event indicator signal 2802 (e.g., power failure interrupt signal from a voltage detector or an external source indicating imminent loss of power to the memory module), the logic device 2800 may be configured to enter backup mode. In backup mode, the logic device 2800 facilitates data storage from volatile memory into non-volatile memory, thereby preventing data loss in the memory module. The logic device 2800 may implement a state machine 2804 (e.g., using a control circuit, a logic module, etc.) to perform backup and/or restore operations depending on the condition of the external triggering event (e.g., state of an external power source). Upon entering backup mode, the logic device 2800 may cause external signal paths to/from the host system to be partially decoupled. For example, in backup mode, the logic device 2800 may electrically decouple the data bus 2824 and/or the address/control bus 2826 to and/or from the host system. Note that other external signal paths (e.g., for module status information, etc.) may remain electrically coupled between the memory module and the host system. In one example, the switch 2822 may be utilized by the logic device 2800 to electrically decouple the data bus 2824 and/or address/control bus 2826 from the host system and electrically couple a first bus (e.g., 2814 and 2816) to/from volatile memory to a second bus 2818 to/from non-volatile memory. The path between the first bus 2814/2816 and the second bus 2818 may include a volatile memory controller 2806 and a non-volatile memory controller 2808. For example, the volatile memory controller 2806 may be adapted to send address information to the volatile memory and retrieve data from such address from the volatile memory. The volatile memory controller 2806 then sends the retrieved information to the non-volatile memory controller 2808 which stores it in non-volatile memory. A buffer 2810 may be placed between the volatile memory controller 2806 and non-volatile memory controller 2808 to temporarily store data being transferred between the first bus (e.g., data bus 2814 and/or address/control bus 2816) and the second bus 2818. In one example, a status register 2812 may also be used to maintain information indicating the state of the logic device 2800 (e.g., SAVE in process, SAVE complete, RESTORE in process, etc.) These status registers 2812 may also allow a host system to configure the operation of the backup and restore logic device 2800.

When the triggering event indicator signal 2802 (e.g., power failure interrupt signal) is cleared (e.g., indicating that power is being provided by the external power source from the host system, or that saved data should be restored from non-volatile memory to volatile memory), the logic device 2800 may be adapted to transfer or restore data from the non-volatile memory to the volatile memory. Again, during this restore operation, the switch 2822 may decouple the data bus 2824 and/or address/control bus 2826 from the first bus 2814/2816 and couples the first bus 2814/2816 to the second bus 2818.

In yet another implementation, the logic device 2800 may be adaptable to send data and address information from the data bus 2824 and/or address/control bus 2826 directly to the non-volatile memory. For example, the switch 2822 may be adapted to electrically couple the data bus 2824 and/or address/control bus 2826 to the second bus 2818. Consequently, data from the data bus 2824 may be sent only to the non-volatile memory or may be sent concurrently to both the volatile memory (via the first bus 2814/1816) and the non-volatile memory (via the second bus 2818). In one implementation, the logic device may be adapted to save data to the non-volatile memory first and subsequently transfer, copy, or save the data from the non-volatile memory to the volatile memory.

Note that in yet another alternative embodiment, the non-volatile memory controller 2808 may optionally include a direct bus 2828 between the switch 2822 and the non-volatile memory controller 2808 to allow transferring data or address/control information directly to the non-volatile memory controller 2808. The direct bus 2828 may include a data bus and/or an address/control bus.

Figure 29:
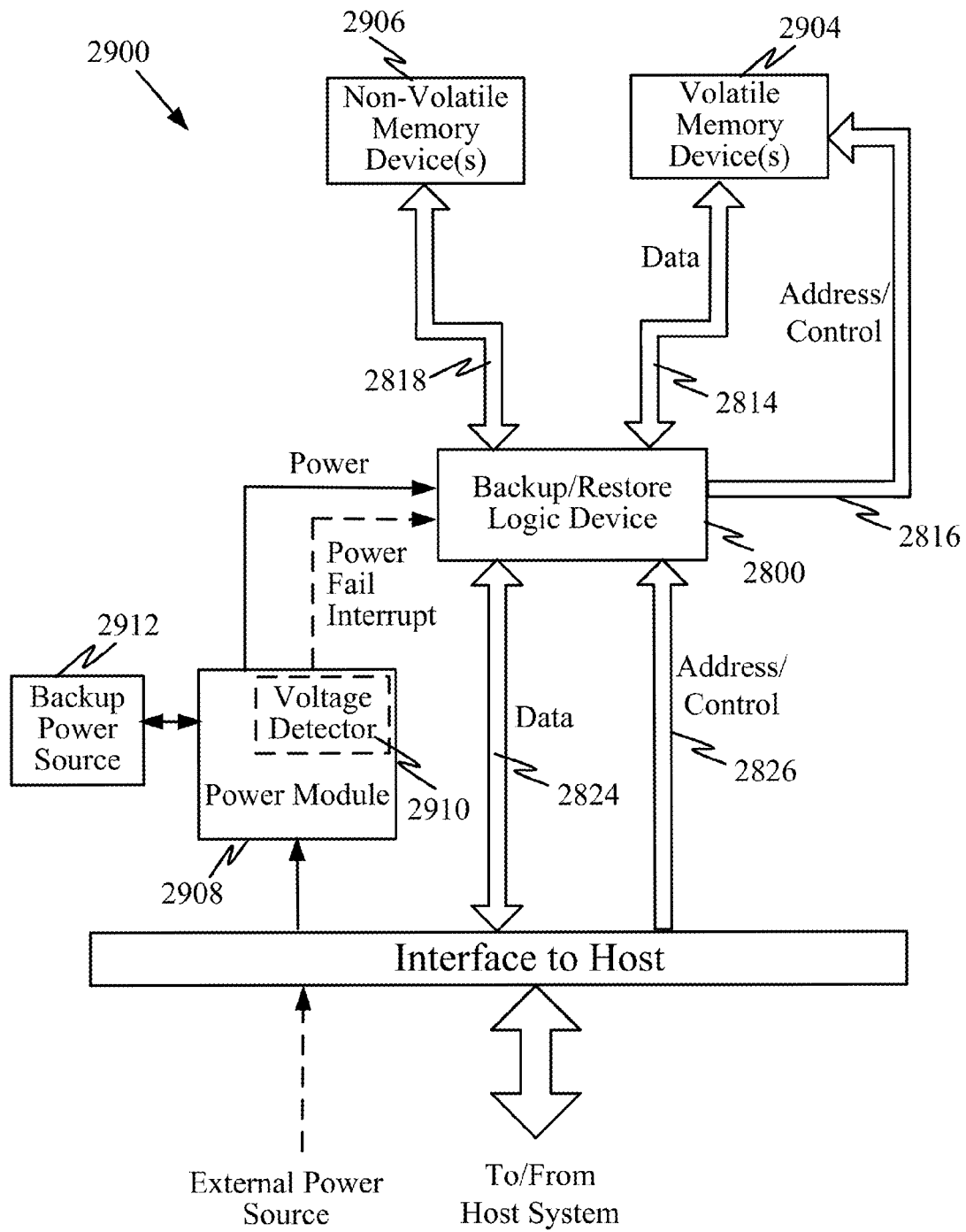
FIG. 29 is a block diagram illustrating how the modified controller of FIG. 28 may be implemented on a memory module having volatile and non-volatile memory and a backup power source.

FIG. 29 is a block diagram illustrating how the modified logic device 2800 of FIG. 28 may be implemented according to one example of a memory module having volatile and non-volatile memory and a backup power source. The memory module 2900 may include a backup/restore logic device 2800, volatile memory devices 2904, non-volatile memory devices 2906, and a power module 2908. The backup/restore logic device 2800 may operate as previously described. When a triggering event indicator (e.g., power fail interrupt signal) is received, the logic device 2800 stores data from the volatile memory devices 2904 to the non-volatile memory devices 2906. When the triggering event indicator (power fail interrupt) clears, then the logic device 2800 restores or copies the data from the non-volatile memory devices 2906 to the volatile memory devices 2904. The power module 2908 may include a voltage detector 2910 capable of sensing an imminent loss of power from an external power source (e.g., host system power) and uses a backup power source 2912 to momentarily power the memory module 2900 to permit a backup process where data is copied from the volatile memory devices 2904 to the non-volatile memory devices 2906. The voltage detector 2910 may generate the power fail interrupt when such power loss event is sensed and may clear the power fail interrupt when external power is again available. The memory module 2900 may also include the backup power source 2912, such as a super-capacitor (or ultra-capacitor) capable of power components of the memory module from 5 to 10 seconds. Note that while this example illustrates a locally generated power fail interrupt as the triggering event indicator, such triggering event indicator may be any local or external signal that can be utilized by the backup/restore logic device 2800 to backup and/or restore data between volatile and non-volatile memory devices.

Figure 30:
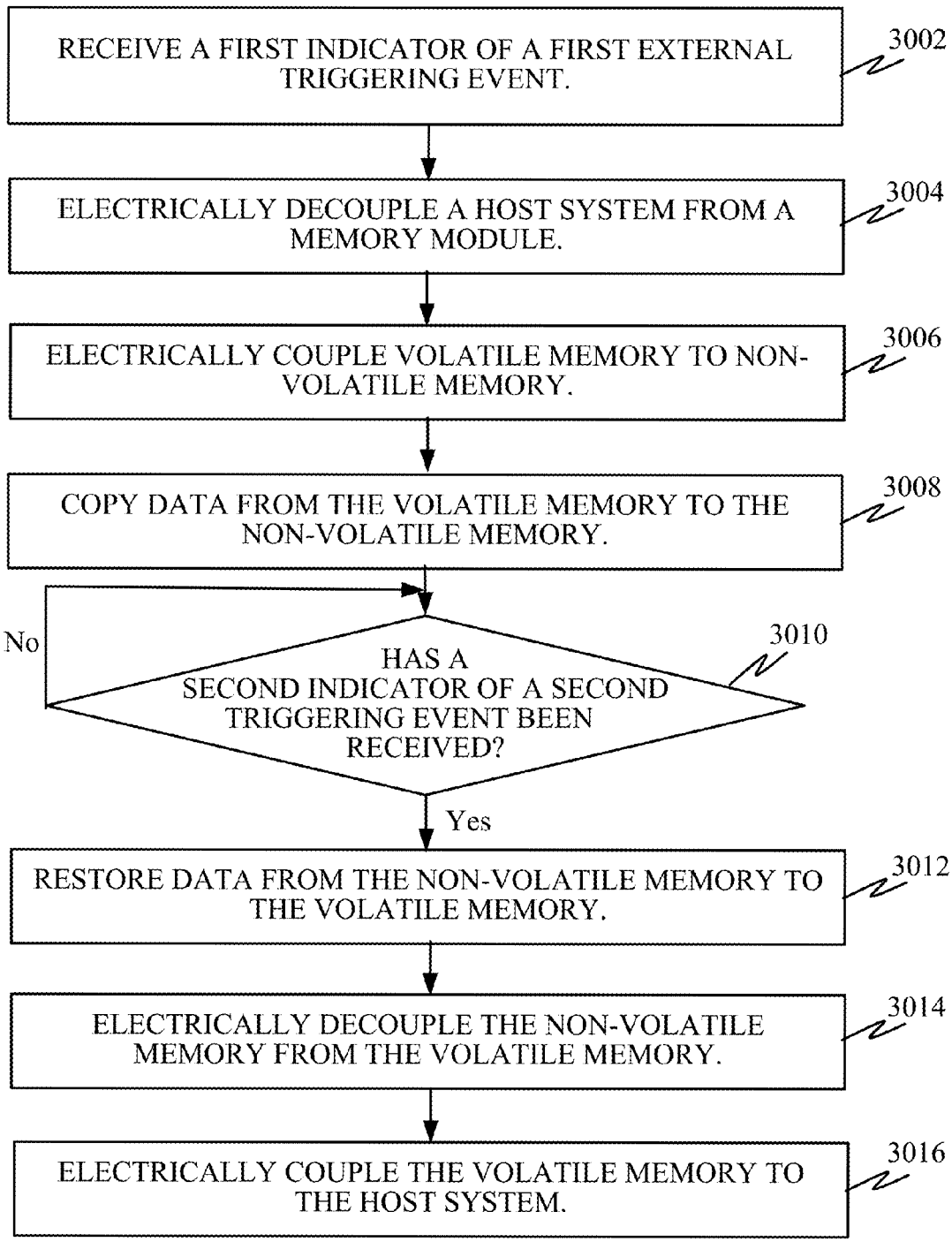
FIG. 30 illustrates a method operational in a backup/restore controller of a memory module having volatile and non-volatile memory.

FIG. 30 illustrates a method operational in a backup/restore logic device of a memory module having volatile and non-volatile memory. A first indicator may be received of a first external triggering event 3002 (e.g., power failure or loss event for an external power source, host system signal or command, etc.). For example, such power may be provided by an external power source (e.g., from the host system). In case of such triggering event/power fail event, the memory module may be configured to provide temporary power to the logic device and/or other components of the memory module for sufficient time to allow backing-up data from volatile memory to non-volatile memory. In response to the first indicator of the first external triggering event, the logic device may electrically decouple a host system from the memory module 3004. For instance, the data bus and/or address/control bus from an external system (e.g., RAID controller) may be decoupled. However, some other signal paths (e.g., memory module status information, etc.) may remain coupled between the memory module and the host system. The logic device then electrically couples the volatile memory to non-volatile memory 3006. The logic device then causes data to be copied from the volatile memory to the non-volatile memory 3008. This backup process may be performed using backup power, after external power has been lost.

The logic device may subsequently determine whether a second indicator of a second triggering event has been received 3010. For example, the second indicator may indicate that the first indicator has cleared. Note that the second indicator may be indicative that the first indicator has been cleared. In some implementations, the second indicator may be received via the same or a different interface than the first indicator. Additionally, the second external triggering event may be independent of the first external triggering event. In other instances, the first indicator (e.g., used for a Save operation) may be triggered by a different event than the second indicator (e.g., used for a Restore operation). For example, the first external triggering event may be a host system power failure event but the second triggering event may be a host system command or signal. If the second indicator is received (e.g., indicating that external power is again available, or that the operator wants to restore backed-up data), the logic device restores data from the non-volatile memory to the volatile memory 3012. The logic device then electrically decouples the non-volatile memory from the volatile memory 3014 and electrically couples the volatile memory to the host system 3016.

Figure 31:
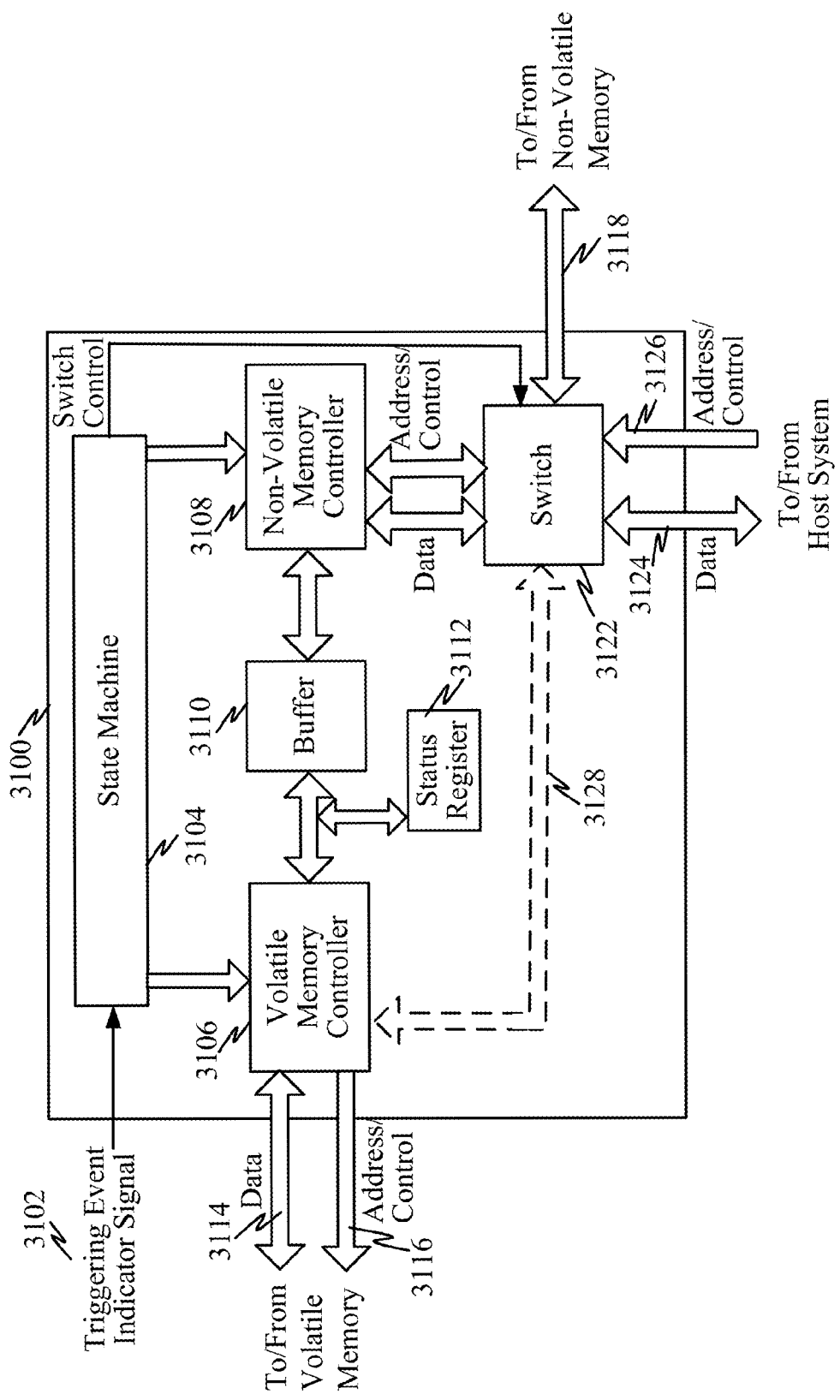
FIG. 31 is a block diagram illustrating another example of the functional modules of an alternative backup and restore logic device that may be utilized by a memory module having volatile memory and non-volatile memory.

FIG. 31 is a block diagram illustrating another example of the functional modules of an alternative backup and restore logic device that may be utilized by a memory module having volatile memory and non-volatile memory. In the logic device 2800 of FIG. 28, the host bus 2824/2826 and first bus 2814/2816 may be coupled directly via the switch 2822. The embodiment of FIG. 28 may contemplate that the host bus 2824/2826 and first bus 2814/2816 carry the same type of signals (e.g., for volatile memory), so an intermediate controller may not be needed. The alternative logic device 3100 may contemplate that the host bus 3124/3126 and a second bus 3118 carry the same type of signals (e.g., for non-volatile memory), so an intermediate controller may not be needed. The logic device 3100 may include a volatile memory controller 3106 and a non-volatile memory controller 3108 to facilitate data transfers between volatile memory and non-volatile memory. A state machine 3104 may serve to configure the operation of the logic device 3100 for different operating modes.

In a first mode of operation, the logic device 3100 may electrically couple a host bus (e.g., data bus 3124 and/or an address/control bus 3126) to non-volatile memory via a corresponding second bus 3118 (e.g., including a data bus and/or address/control bus). In one example, such electrical coupling may be done by a switch 3122.

In one implementation, during the first mode of operation the switch 3122 may concurrently couple the host bus 3124/3126 to volatile memory via a first bus (including data bus 3114 and/or address/control bus 3116). This may be done via an optional direct bus 3128 or via a non-volatile memory controller 3108 and volatile memory controller 3106.

In a second mode of operation the switch 3122 may decouple the host bus 3124/3126 from the second bus 3118 and couples the host bus 3124/3126 to volatile memory via the data bus 3114 and/or address/control bus 3116. This may be done via an optional direct bus 3128 or via a non-volatile memory controller 3108 and volatile memory controller 3106. A buffer 3110 may serve to transfer data between the non-volatile memory controller 3108 and volatile memory controller 3106.

In yet a third mode of operation, upon receiving a triggering event indicator signal 3102 (e.g., power failure interrupt signal from a voltage detector or an external source indicating imminent loss of power to the memory module), the logic device 3100 may be configured to facilitate data transfers from the volatile memory into non-volatile memory, thereby preventing data loss. For example, in the third mode the logic device 3100 may electrically decouple the host bus (e.g., data bus 3124 and/or the address/control bus 3126) to and/or from the host system. Note that other external signal paths (e.g., for module status information, etc.) may remain electrically coupled between the memory module and the host system. In one example, the switch 3122 may be utilized by the logic device 3100 to electrically decouple the host bus (e.g., data bus 3124 and/or address/control bus 3126) from the host system and electrically couple the first bus (e.g., 3114 and 3116) to/from volatile memory to the second bus 3118 to/from non-volatile memory. The path between the first bus 3114/3116 and the second bus 3118 may include the switch 3122, a volatile memory controller 3106 and a non-volatile memory controller 3108. For example, the volatile memory controller 3106 may be adapted to send address information to the volatile memory and retrieve data from such address from the volatile memory. The volatile memory controller 3106 then sends the retrieved information to the non-volatile memory controller 3108 which stores it in non-volatile memory. A buffer 3110 may be placed between the volatile memory controller 3106 and non-volatile memory controller 3108 to temporarily store data being transferred between the first bus (e.g., data bus 3114 and/or address/control bus 3116) and the second bus 3118. In one example, a status register 3112 may also be used to maintain information indicating the state of the logic device 3100 (e.g., SAVE in process, SAVE complete, RESTORE in process, etc.) These status registers 3112 may also allow a host system to configure the operation of the backup and restore logic device 3100. In an alternative approach, an optional bus 3128 may be coupled between the switch 3122 and volatile memory controller 3106 to bypass the non-volatile memory controller 3108.

In a fourth mode of operation, upon receiving an indicator that the triggering event has been cleared, the state machine 3104 may be adapted to cause data to be read from the non-volatile memory via the second bus 3118 and stored in the volatile memory via the first bus 3114/3116 and volatile memory controller 3106.

Figure 32:
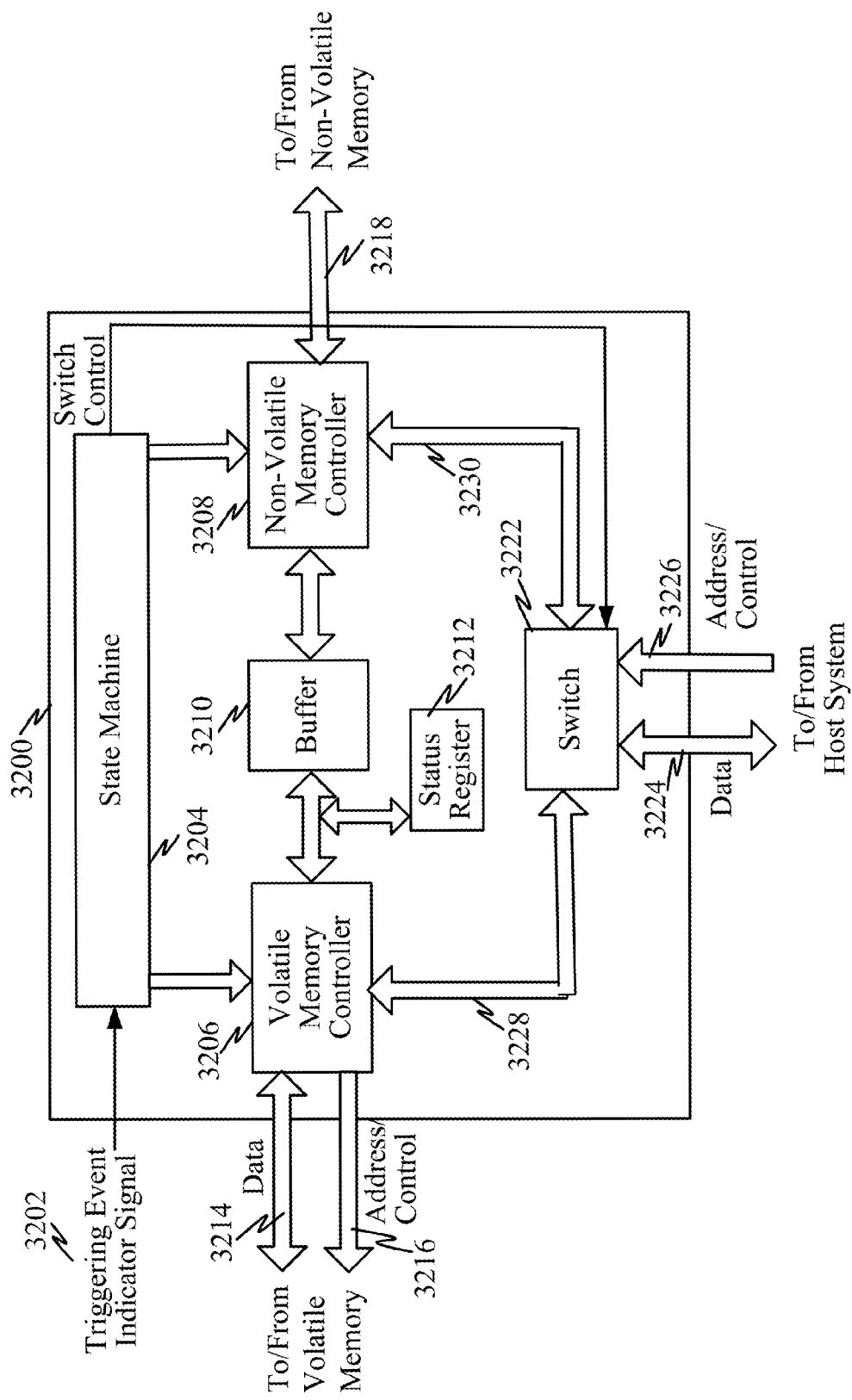
FIG. 32 is a block diagram illustrating another example of the functional modules of an alternative backup and restore logic device that may be utilized by a memory module having volatile memory and non-volatile memory.

FIG. 32 is a block diagram illustrating another example of the functional modules of an alternative backup and restore logic device that may be utilized by a memory module having volatile memory and non-volatile memory. In the logic devices 2800 of FIGS. 28 and 3100 of FIG. 31, the switch 2822/3122 may be coupled directly to either a first bus 2814/2816 (FIG. 28) or a second bus 3118 (FIG. 31). These embodiments may contemplate that the host bus can be coupled directly to at least the first bus or the second bus. In the alternative logic device 3200, the host bus 3224/3226 may be coupled to either the first bus 3214/3216 or the second bus 3218 only via either the volatile memory controller 3206 or the non-volatile memory controller 3208. A state machine 3204 may serve to configure the operation of the logic device 3200 for different operating modes.

In a first mode of operation, the logic device 3200 may electrically couple a host bus (e.g., data bus 3224 and/or an address/control bus 3226) to non-volatile memory via a non-volatile memory controller 3208 and a corresponding second bus 3218 (e.g., including a data bus and/or address/control bus). In one example, a switch 3222 may be used to direct the data to the non-volatile memory controller 3208 via a second direct bus 3230.

In one implementation, during the first mode of operation the switch 3222 may concurrently couple the host bus 3224/3226 to volatile memory via a volatile memory controller 3206 and a first bus (including data bus 3214 and/or address/control bus 3216). This may be done via a first direct bus 3228.

In a second mode of operation the switch 3222 may decouple the host bus 3224/3226 from the second bus 3218 and couples the host bus 3224/3226 to volatile memory via the first bus (e.g., data bus 3214 and/or address/control bus 3216). This may be done via the direct bus 3228 and the volatile memory controller 3206.

In yet a third mode of operation, upon receiving a triggering event indicator signal 3202 (e.g., power failure interrupt signal from a voltage detector or an external source indicating imminent loss of power to the memory module), the logic device 3200 may be configured to facilitate data transfers from the volatile memory into non-volatile memory, thereby preventing data loss. For example, in the third mode the logic device 3200 may electrically decouple the host bus (e.g., data bus 3224 and/or the address/control bus 3226) to and/or from the host system. Note that other external signal paths (e.g., for module status information, etc.) may remain electrically coupled between the memory module and the host system. In one example, the switch 3222 may be utilized by the logic device 3200 to electrically decouple the host bus (e.g., data bus 3224 and/or address/control bus 3226) from the host system and electrically couple the first bus (e.g., 3214 and 3216) to/from volatile memory to the second bus 3218 to/from non-volatile memory. The path between the first bus 3214/3216 and the second bus 3218 may include the volatile memory controller 3206 and the non-volatile memory controller 3208. For example, the volatile memory controller 3206 may be adapted to send address information to the volatile memory and retrieve data from such address from the volatile memory. The volatile memory controller 3206 then sends the retrieved information to the non-volatile memory controller 3208 which stores it in non-volatile memory. A buffer 3210 may be placed between the volatile memory controller 3206 and non-volatile memory controller 3208 to temporarily store data being transferred between the first bus (e.g., data bus 3214 and/or address/control bus 3216) and the second bus 3218. In one example, a status register 3212 may also be used to maintain information indicating the state of the logic device 3200 (e.g., SAVE in process, SAVE complete, RESTORE in process, etc.) These status registers 3212 may also allow a host system to configure the operation of the backup and restore logic device 3200.

In a fourth mode of operation, upon receiving an indicator that the triggering event has been cleared, the state machine 3204 may be adapted to cause data to be read from the non-volatile memory via the second bus 3218 and non-volatile memory controller 3208 and stored in the volatile memory via the first bus 3214/3216 and volatile memory controller 3206.

While various examples described herein may illustrate the logic devices 2400, 2800, 3100, 3200 as being part of a memory module, it should be clear that this logic device may be implemented as part of other modules, circuits, or electrical boards.

It should be recognized that, generally, most of the processing described in this disclosure may be implemented in a similar fashion. Some of the circuit(s) or circuit sections may be implemented alone or in combination as part of an integrated circuit with one or more processors. The one or more of the circuits may be implemented on an integrated circuit, an Advance RISC Machine (ARM) processor, a digital signal processor (DSP), a general purpose processor, an application specific integrated circuit (ASIC), a field-programmable gate array (FPGA), etc.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

As used in this application, the terms "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Moreover, a storage medium may represent one or more devices for storing data, including read-only memory (ROM), random access memory (RAM), magnetic disk storage mediums, optical storage mediums, flash memory devices and/or other machine readable mediums for storing information. The term "machine readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

One or more of the components, steps, and/or functions illustrated in the Figures may be rearranged and/or combined into a single component, step, or function or embodied in several components, steps, or functions without affecting the operation. Additional elements, components, steps, and/or functions may also be added without departing from the invention. The apparatus, devices, and/or components illustrated in the Figures may be configured to perform one or more of the methods, features, or steps described in the Figures. The novel algorithms described herein may be efficiently implemented in software and/or embedded hardware.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. For example, some implementations of the invention may be performed with a moving or static communication device (e.g., access terminal) and a plurality of mobile or static base stations (e.g., access points).

It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A memory device, comprising:
    a volatile memory device;
    a non-volatile memory device;
    a memory control circuit coupled to the volatile memory device and non-volatile memory device;
    a backup power source arranged to temporarily power the volatile memory device, non-volatile memory device, and the memory control circuit upon a loss of power from the external power source;
    a switch to selectively couple:
        (a) a host memory bus to either the volatile memory device or non-volatile memory device; and
        (b) the volatile memory device to the non-volatile memory device,
    wherein upon reestablishment of power by an external power source from a power loss event, the memory control circuit is configured to restore data from the non-volatile memory device to the volatile memory device prior to a host system, to which the memory device couples, completing boot-up.

2. The memory device of claim 1, wherein the memory control circuit is configured to transfer data from the volatile memory device to the non-volatile memory device upon detection of a loss of power from the external power source or an external triggering signal.

3. The memory device of claim 1, wherein the memory control circuit includes a volatile memory controller and a non-volatile memory controller.

4. The memory device of claim 1, further comprising:
a substrate having an edge interface to couple to the host memory bus, the volatile memory device, a non-volatile memory device, the memory control circuit, and the backup power source coupled to at least one surface of the substrate.

5. The memory device of claim 1, wherein the memory control circuit is adapted to sense the reestablishment of power by the external power source.

6. The memory device of claim 1, wherein the memory control circuit receives a triggering signal from the host system indicating that indicates the external power source has reestablished power.

7. The memory device of claim 1, wherein the backup power source powers the memory control circuit prior to the host system completing boot-up.

8. A memory device, comprising:
a volatile memory device;
a non-volatile memory device;
a memory control circuit coupled to the volatile memory device and non-volatile memory device;
means for temporarily powering the volatile memory device, non-volatile memory device, and the memory control circuit upon a loss of power from the external power source;
means for selectively coupling:
  (a) a host memory bus to either the volatile memory device or non-volatile memory device; and
  (b) the volatile memory device to the non-volatile memory device,
wherein upon reestablishment of power by an external power source from a power loss event, the memory control circuit is configured to restore data from the non-volatile memory device to the volatile memory device prior to a host system, to which the memory device couples, completing boot-up.

9. A memory device, comprising:
a volatile memory device;
a non-volatile memory device;
a memory control circuit volatile memory controller coupled to the volatile memory device and non-volatile memory device;
an auxiliary power source arranged to temporarily power the volatile memory device, non-volatile memory device, and the memory control circuit when power from a host power source is unavailable;
a switch to selectively couple:
  (a) a host memory bus to either the volatile memory device or non-volatile memory device; and
  (b) the volatile memory device to the non-volatile memory device,
wherein restoration of data from the non-volatile memory device to the volatile memory device is initiated by an external trigger signal from the host system prior to the host power source being available to the memory device.

10. The memory device of claim 9, wherein the memory control circuit is configured to transfer data from the volatile memory device to the non-volatile memory device upon detection of a loss of power from the external power source or an external triggering signal.

11. The memory device of claim 9, wherein the memory control circuit includes a volatile memory controller and a non-volatile memory controller.

12. The memory device of claim 9, further comprising:
a substrate having an edge interface to couple to the host memory bus, the volatile memory device, a non-volatile memory device, the memory control circuit, and the backup power source coupled to at least one surface of the substrate.

* * * * *